US011107910B2

(12) United States Patent
Harada et al.

(10) Patent No.: US 11,107,910 B2
(45) Date of Patent: Aug. 31, 2021

(54) SEMICONDUCTOR DEVICE

(71) Applicant: FUJI ELECTRIC CO., LTD., Kanagawa (JP)

(72) Inventors: Yuichi Harada, Matsumoto (JP); Misaki Takahashi, Matsumoto (JP); Kouta Yokoyama, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/773,859

(22) Filed: Jan. 27, 2020

(65) Prior Publication Data

US 2020/0161460 A1 May 21, 2020

Related U.S. Application Data

(63) Continuation of application No. PCT/JP2019/002594, filed on Jan. 25, 2019.

(30) Foreign Application Priority Data

Feb. 14, 2018 (JP) .............................. JP2018-024242

(51) Int. Cl.
*H01L 29/739* (2006.01)
*H01L 27/06* (2006.01)
(Continued)

(52) U.S. Cl.
CPC ...... *H01L 29/7397* (2013.01); *H01L 27/0635* (2013.01); *H01L 29/0619* (2013.01);
(Continued)

(58) Field of Classification Search
CPC ............. H01L 29/7397; H01L 27/0635; H01L 29/0619; H01L 29/0657; H01L 29/0696;
(Continued)

(56) References Cited

U.S. PATENT DOCUMENTS 10,438,852 B2 10/2019 Kakimoto
2012/0043581 A1 2/2012 Koyama
(Continued)

FOREIGN PATENT DOCUMENTS

JP 2001217419 A 8/2001
JP 2001332727 A 11/2001
(Continued)

OTHER PUBLICATIONS

International Search Report and (ISA/237) Written Opinion of the International Search Authority for International Patent Application No. PCT/JP2019/002594, by the Japan Patent Office dated May 7, 2019.
(Continued)

*Primary Examiner* — Victor A Mandala

(57) ABSTRACT

Provided is a semiconductor device that includes: a first conductivity type anode region provided in the semiconductor substrate in the diode region; a second conductivity type drift region that is located below the anode region in the semiconductor substrate; a second conductivity type accumulation region that is located between the anode region and the drift region in a depth direction of the semiconductor substrate; and an insulating film that includes a plurality of contact portions extending in a first direction and is provided on an upper surface of the semiconductor substrate; wherein the plurality of contact portions include a first contact portion provided in the diode region; and the first contact portion includes a first non-overlapping region in which an end of the first contact portion and the accumulation region in the first direction do not overlap in the depth direction.

15 Claims, 17 Drawing Sheets

(51) Int. Cl.
*H01L 29/06* (2006.01)
*H01L 29/08* (2006.01)
*H01L 29/10* (2006.01)
*H01L 29/417* (2006.01)
*H01L 29/423* (2006.01)
*H01L 29/861* (2006.01)
*H01L 21/265* (2006.01)
*H01L 21/266* (2006.01)

(52) U.S. Cl.
CPC ...... *H01L 29/0657* (2013.01); *H01L 29/0696* (2013.01); *H01L 29/0821* (2013.01); *H01L 29/1004* (2013.01); *H01L 29/1095* (2013.01); *H01L 29/417* (2013.01); *H01L 29/4236* (2013.01); *H01L 29/4238* (2013.01); *H01L 29/42376* (2013.01); *H01L 29/861* (2013.01); *H01L 21/266* (2013.01); *H01L 21/26513* (2013.01); *H01L 29/1079* (2013.01)

(58) Field of Classification Search
CPC ............. H01L 29/0821; H01L 29/1004; H01L 29/1095; H01L 29/417; H01L 29/4236; H01L 29/42376; H01L 29/4238; H01L 29/861; H01L 21/26513; H01L 21/266; H01L 29/1079; H01L 29/0692; H01L 29/0834; H01L 27/0727; H01L 29/32; H01L 29/407; H01L 29/8613; H01L 29/739
See application file for complete search history.

(56) References Cited

U.S. PATENT DOCUMENTS

| | | |
|---|---|---|
| 2012/0132954 A1 | 5/2012 | Kouno |
| 2016/0247808 A1 | 8/2016 | Horiuchi |
| 2016/0293595 A1 | 10/2016 | Narazaki |
| 2017/0018547 A1* | 1/2017 | Naito ................ H01L 27/0664 |
| 2017/0162562 A1 | 6/2017 | Haruguchi |
| 2017/0162662 A1 | 6/2017 | Naito |
| 2017/0236926 A1 | 8/2017 | Imagawa |
| 2018/0108737 A1* | 4/2018 | Naito ................ H01L 29/1087 |
| 2018/0138299 A1* | 5/2018 | Naito ................ H01L 29/4238 |
| 2018/0158815 A1* | 6/2018 | Onozawa ............ H01L 21/266 |
| 2018/0182754 A1* | 6/2018 | Naito ................ H01L 21/765 |
| 2019/0019885 A1* | 1/2019 | Naito ................ H01L 29/1095 |
| 2019/0096878 A1 | 3/2019 | Arakawa |
| 2019/0158532 A1* | 5/2019 | Davidson ............ G06F 16/957 |
| 2019/0252533 A1* | 8/2019 | Naito ................ H01L 29/0696 |
| 2020/0035817 A1* | 1/2020 | Tamura ............ H01L 29/0611 |

FOREIGN PATENT DOCUMENTS

| | | |
|---|---|---|
| JP | 2011040781 A | 2/2011 |
| JP | 2011243694 A | 12/2011 |
| JP | 2012043890 A | 3/2012 |
| JP | 2012129504 A | 7/2012 |
| JP | 2016197678 A | 11/2016 |
| JP | 2017028244 A | 2/2017 |
| JP | 2017103400 A | 6/2017 |
| JP | 2017135255 A | 8/2017 |
| JP | 2017147300 A | 8/2017 |
| JP | 2017147435 A | 8/2017 |
| JP | 2017224685 A | 12/2017 |
| WO | 2015068203 A1 | 5/2015 |
| WO | 2016098199 A1 | 6/2016 |
| WO | 2017141998 A1 | 8/2017 |
| WO | 2017155122 A1 | 9/2017 |

OTHER PUBLICATIONS

Office Action issued for counterpart Japanese Application No. 2020-500368, issued by the Japan Patent Office dated Apr. 6, 2021 (drafted on Mar. 30, 2021).

* cited by examiner

SEMICONDUCTOR DEVICE

BACKGROUND

1. Technical Field

The present invention relates to a semiconductor device.

A Reverse Conducting IGBT (Insulated Gate Bipolar Transistor) (hereinafter referred to as RC-IGBT) having an IGBT region and an FWD (Free Wheeling Diode) region in a semiconductor substrate is known (for example, see Patent Documents 1 to 8).

PRIOR ART DOCUMENTS

Patent Documents

Patent Document 1: WO 2017/155122
Patent Document 2: WO 2016/098199
Patent Document 3: Japanese Patent Application Publication No. 2017-135255
Patent Document 4: Japanese Patent Application Publication No. 2017-103400
Patent Document 5: Japanese Patent Application Publication No. 2016-197678
Patent Document 6: Japanese Patent Application Publication No. 2011-243694
Patent Document 7: WO No. 2017/141998
Patent Document 8: Japanese Patent Application Publication No. 2017-28244

Technical Problem

In an RC-IGBT, it is preferable to prevent a decrease in the breakdown withstand capability in an FWD region.

General Disclosure

In a first aspect of the present invention, provided is a semiconductor device including a transistor region and a diode region on a semiconductor substrate. The semiconductor device may include a first conductivity type anode region, a second conductivity type drift region, a second conductivity type accumulation region, and an insulating film. The anode region may be provided in the semiconductor substrate in the diode region. The drift region may be provided at least in the diode region. The drift region may be located below the anode region in the semiconductor substrate. The accumulation region may be provided at least in the diode region. The accumulation region may be located between the anode region and the drift region in a depth direction of the semiconductor substrate. The insulating film may include a plurality of contact portions extending in a first direction. The insulating film may be provided on an upper surface of the semiconductor substrate. The plurality of contact portions may include a first contact portion provided in the diode region. The first contact portion may include a first non-overlapping region. The first non-overlapping region may be a region in which an end of the first contact portion and the accumulation region in the first direction do not overlap in the depth direction.

The semiconductor device may further include a first conductivity type base region and the drift region. The base region may be provided in the semiconductor substrate in the transistor region. The drift region may be provided in the transistor region. The drift region may be located below the base region in the semiconductor substrate. The accumulation region may be provided in the transistor region. The accumulation region may be located between the base region and the drift region in a depth direction of the semiconductor substrate. The plurality of contact portions may include a second contact portion provided in the transistor region. The second contact portion may include a second non-overlapping region. The second non-overlapping region may be a region in which an end of the second contact portion and the accumulation region in the first direction do not overlap in the depth direction.

A length of the first non-overlapping region may differ from a length of the second non-overlapping region in the first direction. A length of the first non-overlapping region in the first direction may be larger than a length of the second non-overlapping region in the first direction. A plurality of transistor regions may include an inner transistor region. The inner transistor region may having both sides in the second direction sandwiched by the diode region. An end of the accumulation region in the inner transistor region in the first direction may be closer to an outer peripheral end of the semiconductor substrate than an end of the second contact portion in the first direction.

The semiconductor device may include an active region. An active region may have a plurality of the transistor regions and a plurality of the diode regions. Each of a plurality of the transistor regions may be an outer transistor region located at an end in a second direction. The second direction may be perpendicular to the first direction. A plurality of contact portions may include a plurality of second contact portions. The plurality of second contact portions may be provided in the outer transistor region. Each of the plurality of second contact portions may include a second non-overlapping region. The second non-overlapping region may be a region in which an end of a second contact portion and the accumulation region in the first direction do not overlap. In the outer transistor region located at the end in the second direction, a length of the second non-overlapping region in the first direction may be more increase as the second non-overlapping region is closer to an outer peripheral end of the semiconductor substrate in the second direction.

An entire second contact portion closest to an outer peripheral end of the semiconductor substrate in the second direction among the plurality of second contact portions may not overlap the accumulation region.

The diode region may include a plurality of dummy trench portions and a plurality of first mesa regions. The plurality of dummy trench portions may extend in the first direction. The plurality of dummy trench portions may be arrayed in a second direction. The second direction may be perpendicular to the first direction. The plurality of first mesa regions may be located between two dummy trench portions adjacent in the second direction among the plurality of dummy trench portions. The plurality of first mesa regions may be parts of the semiconductor substrate. At least one first mesa region among the plurality of first mesa regions may not include a first conductivity type contact region at a position where an end of the first contact portion in the first direction overlaps the at least one first mesa region. The contact region may include a higher first conductivity type dopant concentration than the anode region. The contact region may be connected to the first contact portion.

The transistor region may include a plurality of trench portions and a plurality of second mesa regions. The plurality of trench portions may extend in the first direction. The plurality of trench portions may be arrayed in a second direction. The second direction may be perpendicular to the first direction. The plurality of second mesa regions may be located between two trench portions adjacent in the second direction among the plurality of trench portions. The plurality of second mesa regions may be parts of the semiconductor substrate. At least one second mesa region among the plurality of second mesa regions may include the contact region at a position where an end in the first direction of a second contact portion provided in the transistor region among the plurality of contact portions and the at least one second mesa region overlap.

The plurality of second mesa regions may include a boundary mesa region. The boundary mesa region may be adjacent to the diode region in the second direction. The boundary mesa region may not include the contact region. The boundary mesa region may include a first conductivity type base region. The base region may have a lower first conductivity type doping concentration than the contact region.

A first mesa region adjacent to the transistor region among the plurality of first mesa regions may include the contact region at a position where an end of the first contact portion in the first direction and the first mesa region overlap. At least one first mesa region not adjacent to the transistor region among the plurality of first mesa regions may not include the contact region at a position where an end of the first contact portion in the first direction and the first mesa region overlap.

The transistor region may include a second conductivity type collector region. The collector region may be provided at a lower-surface side of the semiconductor substrate. The diode region may include a first conductivity type cathode region. The cathode region may be provided at the lower-surface side of the semiconductor substrate. The lower surface side boundary may be located closer to a side of the diode region than an upper surface side boundary in a second direction. The lower surface side boundary may be a boundary between the collector region and the cathode region. The second direction may be perpendicular to the first direction. The upper surface side boundary may be a boundary between the transistor region and the diode region at the upper-surface side of the semiconductor substrate.

A first retracted length of the cathode region may be equal to or greater than a second retracted length of the cathode region. The first retracted length of the cathode region may be a length from the lower surface side boundary to the upper surface side boundary in the second direction. The second retracted length of the cathode region may be a length from an outer peripheral end of the semiconductor substrate in the first direction to an end of the cathode region closest to the outer peripheral end.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention is described through the embodiments of the invention. However, the following embodiments do not limit the invention according to the claims. Moreover, all the features of the combinations described in the embodiments are not necessarily essential as means for solving the problems of the invention.

In this specification, one side in a direction parallel to the depth direction of a semiconductor substrate 10 is referred to as an "upper" side, and the other side is referred to as a "lower" side. In the present specification, one surface among two principal surfaces of a substrate, a region, a layer, or another member is referred to as an upper surface and the other surface is referred to as a lower surface. The "upper" and "lower" directions are not limited to a gravity direction or an attachment direction in which a semiconductor device is attached to a wiring substrate or the like.

Figure 1:
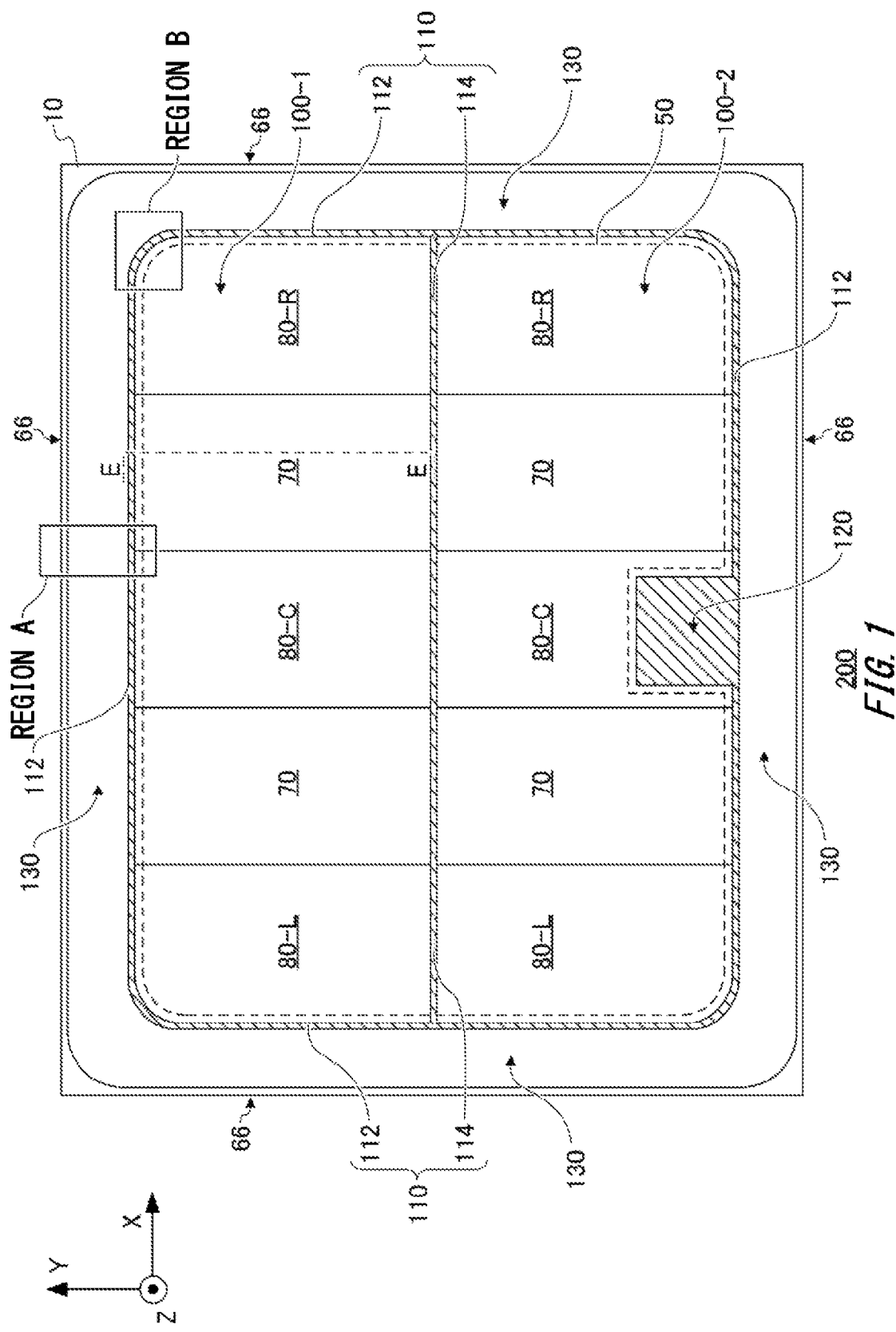
FIG. 1 is a schematic view illustrating an upper surface of a semiconductor device 200.

FIG. 1 is a schematic view illustrating an upper surface of a semiconductor device 200. The semiconductor device 200 of the present example is an RC-IGBT having an IGBT region 80 and a FWD region 70 in a semiconductor substrate 10. The IGBT region 80 is one example of a transistor region and the FWD region 70 is one example of a diode region. The semiconductor substrate 10 of the present example has a substantially rectangular shape as seen from above. The semiconductor substrate 10 of the present example has, at an an end in a positive Z-axis direction, an upper surface parallel to an X-Y plane (one principal surface) and has, at an end in a negative Z-axis direction, a lower surface parallel to the X-Y plane (the other principal surface).

In the present example, an X axis and a Y axis are perpendicular to each other and a Z axis is perpendicular to the X-Y plane. The X axis, the Y axis, and the Z axis form a so-called right-handed system. In the present example, a Y-axis direction is one example of a first direction and an X-axis direction is one example of a second direction. A Z-axis direction is parallel to a depth direction of the semiconductor substrate 10.

The semiconductor device 200 of the present example includes an active region 100, a gate runner portion 110, a gate pad portion 120, and an edge termination region 130. The gate runner portion 110 of the present example includes an annular gate runner portion 112 and an extending gate runner portion 114. A shape of the annular gate runner portion 112 of the present example corresponds to a rectangle with rounded corners. The annular gate runner portion 112 may surround a plurality of IGBT regions 80 and a plurality of FWD regions 70 in the X-Y plane. The annular gate runner portion 112 of the present example surrounds the outer periphery of a region in which the plurality of IGBT regions 80 and the plurality of FWD regions 70 are provided.

The extending gate runner portion 114 may be provided between at least two IGBT regions 80 that are adjacent to each other in the Y-axis direction. The extending gate runner portion 114 of the present example extends in the X-axis direction by passing between the IGBT regions 80 that are adjacent in the Y-axis direction and between the FWD regions 70 that are adjacent in the Y-axis direction. The extending gate runner portion 114 of the present example extends from a first side of the rectangular annular gate runner portion 112 parallel to the Y-axis direction to a second side opposing the first side in the X-axis direction.

The gate runner portion 110 may include a gate runner layer and a gate metal layer located on the gate runner layer. The gate runner layer and the gate metal layer may be electrically connected to each other at a predetermined contact portion. The gate runner portion 110 may be electrically connected to the gate pad portion 120.

The gate runner portion 110 may have a function of supplying a control signal (for example, a gate potential) transmitted from the gate pad portion 120 to the IGBT region 80. A wire may be bonded or otherwise connected to the gate pad portion 120. The gate pad portion 120 may receive a control signal from an external terminal through the wire. The gate pad portion 120 may also have a structure in which a gate runner layer and a gate metal layer are stacked as similar to the gate runner portion 110. The gate pad portion 120 of the present example is provided so as to cut out a part of an IGBT region 80 located at the center in the X-axis direction.

The active region 100 of the present example is provided inside the gate runner portion 110. The active region 100 of the present example includes a first active region 100-1 and a second active region 100-2. The first active region 100-1 is surrounded by a half of the annular gate runner portion 112 on the positive side in the Y-axis direction and the extending gate runner portion 114. On the other hand, the second active region 100 is surrounded by a half of the annular gate runner portion 112 on the negative side in the Y-axis direction, the gate pad portion 120, and the extending gate runner portion 114. The active region 100 may be a region corresponding to the X-Y plane range of an emitter electrode 50, excluding the region of the extending gate runner portion 114. FIG. 1 illustrates the X-Y plane range of the emitter electrode 50 by a dashed line.

In the present example, the first active region 100-1 and the second active region 100-2 each include a plurality of IGBT regions 80 and a plurality of FWD regions 70. The plurality of IGBT regions 80 may be separated from one another in the X-axis direction. In the present example, three IGBT regions 80 are separated from one another by a predetermined interval in the X-axis direction. IGBT regions 80-L and 80-R are provided at both ends of each of the first active region 100-1 and the second active region 100-2 in the X-axis direction instead of the FWD regions 70. An IGBT region 80-C whose both sides in the X-axis direction are sandwiched between the FWD regions 70 is provided at the center in the X-axis direction. The IGBT regions 80-L and 80-R are examples of an outer transistor region and the IGBT region 80-C is one example of an inner transistor region.

In the present example, an FWD region 70 is provided between two IGBT regions 80 adjacent to each other in the X-axis direction and in contact with each of the two IGBT regions 80. Therefore, in the active region 100, the number of FWD regions 70 may be smaller than the number of IGBT regions 80. In the present example, each of the first active region 100-1 and the second active region 100-2 includes two FWD regions 70. The numbers of the IGBT regions 80 and the FWD regions 70 are merely an example, and the numbers of the IGBT regions 80 and the FWD regions 70 may be larger or smaller than those in the present example.

The edge termination region 130 may be provided between an outer peripheral end 66 of the semiconductor substrate 10 and the annular gate runner portion 112. The edge termination region 130 may be provided in an annular shape to surround the gate runner portion 110 located outside the active region 100. The edge termination region 130 of the present example surrounds the outside of the annular gate runner portion 112. The edge termination region 130 may have a function of relaxing an electric field concentration at an upper-surface side of the semiconductor substrate 10. The edge termination region 130 includes, for example, a guard ring, a field plate, a RESURF and a structure obtained by combining these.

Figure 2:
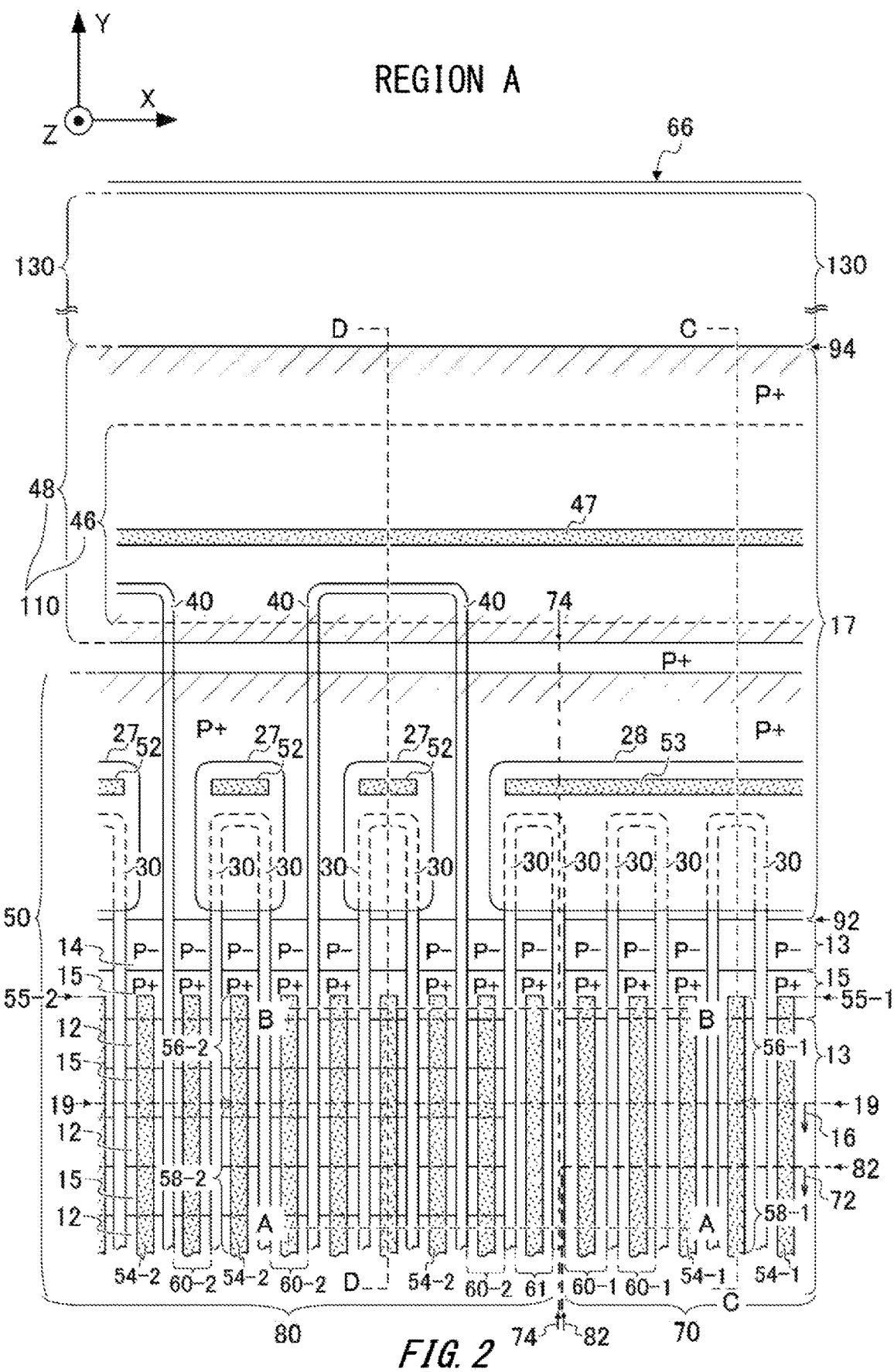
FIG. 2 is an enlarged view of a region A of FIG. 1 in the first embodiment.

FIG. 2 is an enlarged view of a region A of FIG. 1 in the first embodiment. The region A includes a region in which an upper surface side boundary 74 that is a boundary between the IGBT region 80 and the FWD region 70 at the upper-surface side of the semiconductor substrate 10 intersects with the edge termination region 130. In FIG. 2, the upper surface side boundary 74 is illustrated by a long dashed short dashed line. In the present specification, the upper surface side boundary 74 is an imaginary straight line parallel to the Y-axis direction and is located on one of dummy trench portions 30 in a boundary mesa region 61 which is closer to the FWD region 70. The boundary mesa region 61 is a mesa region adjacent to a side of the FWD region 70 relative to a mesa region 60 having an (N+)-type emitter region 12 among a plurality of mesa regions 60-2 in the IGBT region 80. The boundary mesa region 61 is a mesa region 60-2 that is included in the mesa regions 60-2 in the IGBT region 80 and is closest to and adjacent to the FWD region 70 in the X-axis direction and does not include an (N+)-type emitter region 12.

In the present specification, an upper part in the semiconductor substrate 10 located between two trench portions adjacent in the X-axis direction is referred to as a mesa region 60. In the present example, the mesa region 60-1 of the FWD region 70 is one example of a first mesa region and the mesa region 60-2 of the IGBT region 80 is one example of a second mesa region. The mesa region 60-1 of the FWD region 70 may include a (P−)-type anode region 13, a (P+)-type contact region 15, an N-type accumulation region 16 and a (P+)-type well region 17. The mesa region 60-2 of the IGBT region 80 may include an (N+)-type emitter region 12, a (P−)-type base region 14, a (P+)-type contact region 15, an N-type accumulation region 16, and a (P+)-type well region 17.

The base region 14 may function as a channel formation region and the anode region 13 may function as an anode.

The names of the anode region 13 and the base region 14 are merely provided in accordance with the arrangement of the regions. The anode region 13 and the base region 14 may be formed through the same dopant implantation process. In the present example, the anode region 13 and the base region 14 have the same P-type dopant concentration. In the present example, the P-type is an example of a first conductivity type and the N-type is an example of a second conductivity type. In another example, the P-type may be a second conductivity type and the N-type may be a first conductivity type. N and P indicate that the majority carriers are electrons and holes respectively. With respect to a symbol "+" or "−" described in N or P, N or P described with + has a higher carrier concentration than N or P not described with + and N or P described with − has a lower carrier concentration that N or P not described with −.

The semiconductor device 200 has insulating films such as an interlayer dielectric film on the upper surface of the semiconductor substrate 10, but these insulating films are omitted in FIG. 2. The insulating film such as the interlayer dielectric film may have a plurality of openings at different positions in the X-Y plane. FIG. 2 illustrates the plurality of openings as contact portions 47, 52, 53, and 54. The contact portion 47 is an opening portion that connects the gate metal layer 48 to the gate runner layer 46.

The contact portion 52 is an opening portion provided in the IGBT region 80 and the contact portion 53 is an opening portion provided in the FWD region 70. In the present example, the contact portion 52 connects an island-like connection layer 27 to the emitter electrode 50. In the present example, the contact portion 53 connects an island-like connection layer 28 extending in the X-axis direction to the emitter electrode 50. In the present example, the gate runner layer 46 and the connection layers 27 and 28 are polysilicon layers formed through the same deposition process and etching process.

The contact portion 54 of the present example may connect the emitter electrode 50 to semiconductor regions exposed at the upper surface of the semiconductor substrate 10. In the present example, an extending direction in which the contact portion 54 extends is parallel to the Y-axis direction. A contact portion 54 in the FWD region 70 and a contact portion 54 in the IGBT region 80 may have the same shape. The contact portion 54 of the present example has a strip shape having a width smaller than the length of the mesa region 60 in the X-axis direction and extending in the Y-axis direction. In the present example, a contact portion 54 in the FWD region 70 and a contact portion 54 in the IGBT region 80 have ends 55 at the same position in the Y-axis direction. In FIG. 2, a length between the end of the gate runner portion 110 in the negative Y-axis direction to the end 55 of the contact portion 54 is, for example, 10 µm. With respect to the positions of ends 55 in the Y-axis direction, the position of an end 55-2 of the contact portion 54 in the IGBT region 80 in the Y-axis direction may extend to a position beyond the position of an end 55-1 of the contact portion 54 in the FWD region 70 in the Y-axis direction.

The semiconductor device 200 of the present example has dummy trench portions 30 and gate trench portions 40 each provided from the upper surface of the semiconductor substrate 10 to a predetermined depth. In the present specification, the dummy trench portions 30 and the gate trench portions 40 may be collectively referred to as trench portions. While the gate potential is supplied to a gate conductive portion of the gate trench portion 40, the same potential as the emitter electrode 50 (emitter potential) is supplied to a dummy trench conductive portion of the dummy trench portion 30 instead of the gate potential.

The FWD region 70 of the present example includes a plurality of dummy trench portions 30. Each dummy trench portion 30 in the FWD region 70 includes two longitudinal portions and one lateral portion. In the present example, a longitudinal portion is a portion that extends parallel to the extending direction of the contact portion 54. In FIG. 2, the two longitudinal portions and one lateral portion in the dummy trench portion 30 form an inverted U shape. The two longitudinal portions may oppose each other in the X-axis direction and each extend in the Y-axis direction. One lateral portion may connect the two longitudinal portions through ends in the Y-axis direction. In the present example, longitudinal portions of each dummy trench portion 30 are arrayed at a predetermined interval in the X-axis direction. Therefore, each mesa region 60-1 of the present example has the same width in the X-axis direction.

The IGBT region 80 of the present example includes a plurality of dummy trench portions 30 and a plurality of gate trench portions 40. Each gate trench portion 40 also includes two longitudinal portions and one lateral portion. In FIG. 2, the two longitudinal portions and one lateral portion of the gate trench portion 40 form an inverted U shape. The two longitudinal portions may oppose each other in the X-axis direction and each extend in the Y-axis direction. The one lateral portion may connect the two longitudinal portions through ends in the Y-axis direction.

In the present example, the longitudinal portions of the gate trench portion 40 are arrayed in the X-axis direction at twice a pitch of the longitudinal portions of the dummy trench portions 30 in the FWD region 70. In the IGBT region 80, the two longitudinal portions of each dummy trench portion 30 are provided between two longitudinal portions of each gate trench portion 40 that are adjacent in the X-axis direction.

In the IGBT region 80 of the present example, the distance between a longitudinal portion of the dummy trench portion 30 and a longitudinal portion of the gate trench portion 40 in the X-axis direction is equal to the distance between two longitudinal portions of each dummy trench portion 30 that are adjacent in the X-axis direction. In the present example, the width of each of the mesa region 60-1, the mesa region 60-2, and the boundary mesa region 61 in the X-axis direction is 2.3 µm.

The longitudinal portions of the gate trench portions 40 of the present example are longer in the Y-axis direction than the longitudinal portions of the dummy trench portions 30. The gate trench portion 40 reaches a position below the gate runner portion 110 in the Y-axis direction. The lateral portion of the gate trench portion 40 is located below the gate runner layer 46 to be connected to the gate runner layer 46. On the other hand, the dummy trench portion 30 does not reach the gate runner portion 110 in the Y-axis direction. In the present example, the bottom of each lateral portion of the gate trench portion 40 and the dummy trench portion 30 is covered by the well region 17. The bottom of a part of a longitudinal portion located in the vicinity of a lateral portion of each trench portion is also covered by the well region 17.

The (P+)-type contact region 15 may have a higher P-type dopant concentration than the anode region 13 or the base region 14. The contact region 15 may function as a low resistance path for holes when holes are extracted from the semiconductor substrate 10 to the emitter electrode 50. In the present example, the contact region 15 in the FWD region 70 is connected to the first contact portion 54-1 on the mesa region 60-1. Similarly, the contact region 15 in the IGBT region 80 is also connected to the second contact portion 54-2 on the mesa region 60-2.

The (P+)-type well region 17 may be provided below the gate runner portion 110. The well region 17 of the present example is provided from an outer end 94 to an inner end 92 in the Y-axis direction. In the present example, the outer end 94 is located outside an outer end of the gate runner portion 110. The inner end 92 is located between the lateral portions of the dummy trench portions 30 and the ends 55 of the contact portions 54.

The well region 17 may also have a higher P-type dopant concentration than the anode region 13 and the base region 14. The well region 17 may have a function of separating the base region 14 and the anode region 13 from the vicinity of the outer peripheral end 66. The well region 17 may be exposed at the upper surface of the semiconductor substrate 10. However, in the present example, an insulating film is provided on the upper surface of the semiconductor substrate 10 in a range corresponding to the well region 17, and thus, the gate runner layer 46 and the connection layers 27 and 28 are electrically isolated from the well region 17.

An (N+)-type emitter region 12 may function as a low resistance path for electrons when electrons are implanted into the semiconductor substrate 10. In the present example, emitter regions 12 are provided only to the mesa regions 60-2 in the IGBT region 80. The emitter region 12 or the contact region 15 located below the contact portion 54-2 is illustrated by a dashed line. In the present example, to reduce a current interference, the emitter region 12 is not provided in the boundary mesa region 61 which is a mesa region 60-2 in the IGBT region 80 and is adjacent to the FWD region 70. This can reduce flowing out, to the cathode region 72 in the FWD region 70, of electrons implanted from the emitter region 12 in the IGBT region 80 to the drift region. In another example, an (N+)-type region (for example, emitter region 12) may be provided in the boundary mesa region 61 or a mesa region 60-1 in the FWD region 70. In this case, the (N+)-type region may be adjacent to a dummy trench portion 30 or the like, but is preferably not adjacent to a gate trench portion 40.

A mesa region 60-2 in the IGBT region 80 includes emitter regions 12 and contact regions 15 that are alternately exposed at the upper surface in the Y-axis direction. In the mesa region 60-2, the emitter regions 12 and the contact regions 15 are provided across two trench portions adjacent in the X-axis direction. The mesa region 60-2 of the present example has a contact region 15 immediately below the end 55-2 of the contact portion 54-2. The contact region 15 located immediately below the end 55-2 may be sandwiched between the base region 14 and the emitter region 12 in the Y-axis direction.

The well region 17 and the base region 14 are provided in the same range as the mesa region 60-2 in the boundary mesa region 61 of the IGBT region 80. In a range other than the well region 17 and the base region 14 in the boundary mesa region 61, contact regions 15 are provided. In the boundary mesa region 61 of the present example, the (P+)-type contact regions 15 are mainly exposed at the upper surface in the Y-axis direction.

Also in a mesa region 60-1 of the FWD region 70 also, the well region 17 and the anode region 13 corresponding to the base region 14 are provided in the same range as the mesa region 60-2. Also in a mesa region 60-1 also, a contact region 15 is provided immediately below the end 55-1 of the contact portion 54-1. The contact region 15 in the mesa region 60-1 may be provided in a range corresponding to the contact region 15 located below the end 55-2 of the mesa region 60-2 in the X-axis direction. Remaining regions in the mesa region 60-1 may be anode regions 13.

In the semiconductor device 200 of the present example, both the FWD region 70 and the IGBT region 80 have N-type accumulation regions 16. In the present example, an accumulation region 16 is provided between the anode region 13 and the base region 14, and a drift region in the depth direction of the semiconductor substrate 10. The drift region will be illustrated in FIG. 3. This allows increasing the carrier injection enhancement effect (IE effect) in the IGBT region 80 and decreasing the on-voltage (Von) of the IGBT.

As similar to another dopant implantation region, the accumulation region 16 may also be formed by the ion implantation of N-type dopants in a predetermined depth range of the semiconductor substrate 10 through an opening region of a resist mask. Mask sags (deformation of edge portions of the mask from the right-angled shape to a gentle sloped portion) occurs at end portions of the opening of the resist mask, and thus, the depth range of the accumulation region 16 is likely to be deviated from a designed depth at positions of the semiconductor substrate 10 corresponding to the end portions of the opening. If the FWD region 70 includes no accumulation regions 16 while the IGBT region 80 includes accumulation regions 16, the accumulation regions 16 are discontinuous from the IGBT region 80 to the FWD region 70. This leads to the formation of an accumulation region 16 deviated from a design depth to the discontinuous portion. In the present example, an accumulation region 16 is provided in the FWD region 70 in addition to the IGBT region 80 to prevent the characteristics of the IGBT, such as the gate threshold voltage from being affected by the formation of the accumulation region 16 deviated from the design depth in the mesa region 60-2.

The N-type accumulation region 16 has a function of accumulating holes between an accumulation region 16 and a drift region in the depth direction. This allows an accumulation region 16 preventing the extraction of holes from the contact portion 54. Therefore in the present example, an end 19 of an accumulation region 16 in the positive Y-axis direction is provided inside an end 55 of the contact portion 54 in the positive Y-axis direction. Therefore, in the present example, carriers (in the present example, holes) are easily extracted to an emitter electrode 50 through the contact portion 54. Accordingly, in the FWD region 70, the amount of carriers during the reverse recovery operation can be reduced, and thus, the reverse recovery withstand capability can be improved compared to when the first contact portion 54-1 and the accumulation region 16 are completely overlapped.

The FWD region 70 includes a plurality of first contact portions 54-1 that are separate from one another in the X-axis direction and extend individually in the Y-axis direction. In the present example, the first contact portion 54-1 in the FWD region 70 includes a first non-overlapping region 56-1 and a first overlapping region 58-1. The first non-overlapping region 56-1 is a region in which the first contact portion 54-1 and the accumulation region 16 in the Y-axis direction do not overlap in the depth direction. On the other hand, the first overlapping region 58-1 is a region in which the first contact portion 54-1 and the accumulation region 16 in the Y-axis direction overlap in the depth direction.

In the present example, a (P+)-type contact region 15 is provided immediately below the first non-overlapping region 56-1 in the first contact portion 54-1. Therefore, holes are easily extracted to an emitter electrode 50 through the contact region 15 located immediately below the first non-overlapping region 56-1. On the other hand, in the present example, an anode region 13 is provided immediately below the first overlapping region 58-1 instead of the contact region 15.

The end 19 of the accumulation region 16 of the present example in the positive Y-axis direction is parallel to the X-axis direction. In the present example, the end 19 of the accumulation region 16 in the positive Y-axis direction is located between an end 55-1 of a contact portion 54-1 and an end 55-2 of a contact portion 54-2, and an end of the cathode region 72 (that is, lower surface side boundary 82). A length between the end 55 of the contact portion 54 and the end 19 of the accumulation region 16 in the positive Y-axis direction is, for example, several μm or more to 20 μm or less. Therefore, it is not necessary to consider an influence on characteristics of a gate threshold voltage or the like of an IGBT due to the deviation from a design depth of the accumulation region 16.

The IGBT region 80 includes a plurality of second contact portions 54-2 that are separated from one another in the X-axis direction and extend individually in the Y-axis direction. In the present example, the second contact portion 54-2 in the IGBT region 80 includes a second non-overlapping region 56-2 and a second overlapping region 58-2. The second non-overlapping region 56-2 is a region in which the second contact portion 54-2 and the accumulation region 16 in the Y-axis direction do not overlap in the depth direction. On the other hand, the second overlapping region 58-2 is a region in which the second contact portion 54-2 and the accumulation region 16 in the Y-axis direction overlap in the depth direction.

In the present example, the first non-overlapping region 56-1 and the second non-overlapping region 56-2 are merely provided in the vicinity of the ends 55-1 and 55-2 of the contact portion 54 in the Y-axis direction and most portions of the contact portion 54 are the first overlapping region 58-1 and the second overlapping region 58-2. This allows obtaining a sufficient IE effect in the IGBT region 80 while improving a reverse recovery withstand capability in the FWD region 70.

The gate metal layer 48 may be electrically connected to the gate runner layer 46 via the contact portion 47. The gate runner layer 46 may be a conductive layer made of polysilicon including dopants. The gate runner layer 46 may be formed in processes of forming a gate conductive portion, a dummy trench conductive portion, a connection layer 27 and a connection layer 28 made of polysilicon as the gate runner layer 46.

An emitter electrode 50 may be provided on an entire active region 100. The emitter electrode 50 of the present example is spaced apart from the gate metal layer 48 in the Y-axis direction so as not to be short-circuited with the gate metal layer 48. The emitter electrode 50 may be electrically connected to one or more of the emitter region 12, the anode region 13, the base region 14, and the contact region 15 in the mesa region 60 through the contact portion 54. The emitter electrode 50 of the present example is electrically connected to the anode region 13 and the contact region 15 in the FWD region 70 via the first contact portion 54-1 and is electrically connected to the emitter region 12 and the contact region 15 in the IGBT region 80 via the second contact portion 54-2.

The emitter electrode 50 may be electrically connected to dummy trench conductive portions of the dummy trench portions 30 through the contact portions 52 and 53. The connection layer 27 and the connection layer 28 of the present example are connected to dummy trench conductive portions of the dummy trench portions 30. However, an insulating film such as an oxide film is provided between the connection layer 27 and the connection layer 28, and the upper surface of the semiconductor substrate 10 in a region in which the connection layer 27 and the connection layer 28, and the dummy trench portions 30 do not overlap.

Each of the emitter electrode 50 and the gate metal layer 48 may be a metal layer. Each metal layer is made of, for example, aluminum (Al), aluminum (Al)-silicon (Si) metal alloy, or aluminum (Al)-silicon (Si)-copper (Cu) metal alloy. Each metal layer may have a barrier metal made of titanium (Ti), a titanium compound or the like at a layer below a region made of aluminum or the like. A plug formed of tungsten (W) or the like may be provided in the contact portions 47, 52 and 54.

FIG. 2 illustrates with a dashed line a range provided with an (N+)-type cathode region 72 exposed at a lower-surface side of the semiconductor substrate 10. In the present example, an end of the cathode region 72 in the positive Y-axis direction is provided inside an end 19 of the accumulation region 16 in the positive Y-axis direction. A length from an end of the gate runner portion 110 in the negative Y-axis direction to an end of the cathode region 72 is, for example, 50 μm. A length from an end 55 of the contact portion 54 to an end of the cathode region 72 is, for example 20 μm or more and 40 μm or less. In the present example, an end of the cathode region 72 in the negative X-axis direction (that is, lower surface side boundary 82) matches the upper surface side boundary 74. To facilitate understanding, the lower surface side boundary 82 and the upper surface side boundary 74 overlapping in the Y-axis direction are illustrated by being shifted from each other in the X-axis direction.

The end 19 of the accumulation region 16 may be closer to an end of the cathode region 72 in the positive Y-axis direction than the end 55 of the contact portion 54. An end of the cathode region 72 in the positive Y-axis direction may mean the lower surface side boundary 82 that is closer to the annular gate runner portion 112 than the extending gate runner portion 114 in the Y-axis direction and extends parallel to the X-axis direction.

A (P+)-type collector region may be provided in an entire region of a lower-surface side of the semiconductor substrate 10 other than a region in which the cathode region 72 is exposed. Therefore, in FIG. 2, the illustration of a range of a collector region is omitted. A collector region of the present example is provided in an entire IGBT region 80.

Figure 3:
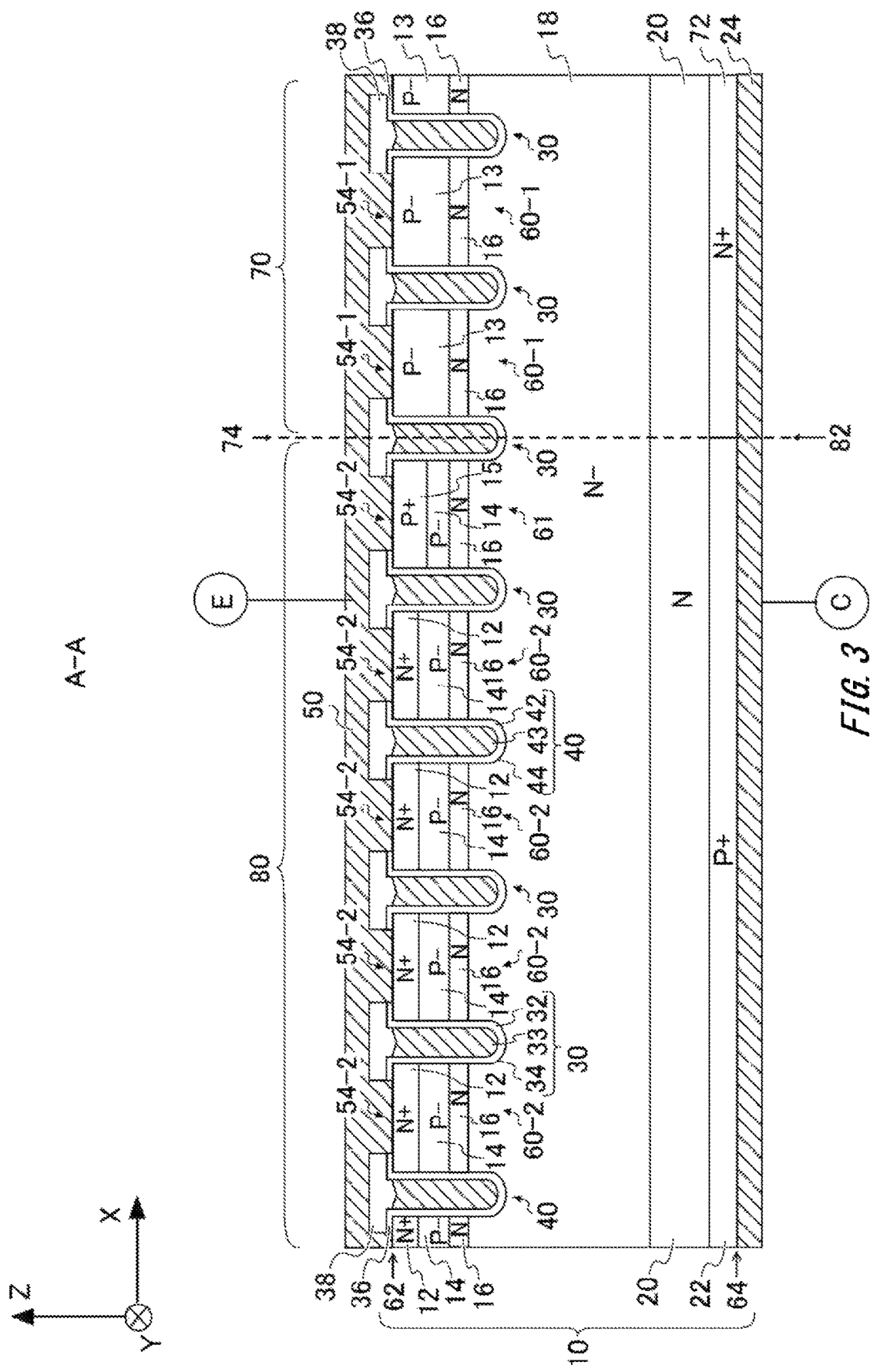
FIG. 3 illustrates the A-A cross section of FIG. 2.

FIG. 3 illustrates the A-A cross section in FIG. 2. The A-A cross section is parallel to the X-Z plane and is provided through an upper surface 62 and a lower surface 64 of the semiconductor substrate 10. The A-A cross section is a cross section inside an end of the cathode region 72 in the positive Y-axis direction and is provided through the emitter region 12, the accumulation region 16, and the cathode region 72. In the A-A cross section, a semiconductor substrate 10, an insulating film 36 and an interlayer dielectric film 38, an emitter electrode 50, and a collector electrode 24 are illustrated.

The insulating film 36 and the interlayer dielectric film 38 of the present example are oxide films that are provide above trench portions by being stacked each other. The insulating film 36 may be a silicon dioxide ($SiO_2$) film. The insulating film 36 may be formed thorough the same process as a dummy trench insulating film 32 and a gate insulating film 42 of each trench portion. The interlayer dielectric film 38 may be formed of one or more materials among BPSG (Boro-Phospho Silicate Glass), PSG (Phosphorus Silicate Glass), and BSG (Borosilicate Glass).

The emitter electrode 50 of the present example is in contact to an upper surface 62 and the interlayer dielectric film 38 and extends over an IGBT region 80 and a FWD region 70. A collector electrode 24 is in contact to a lower surface 64 and is provided over the entire lower surface 64. The collector electrode 24 may be made of the same material as the emitter electrode 50.

A semiconductor substrate 10 in the A-A cross section includes dummy trench portions 30 and gate trench portions 40. The semiconductor substrate 10 in the A-A cross section includes an (N+)-type emitter region 12, a (P−)-type anode region 13, a (P−)-type base region 14, a (P+)-type contact region 15, an N-type accumulation region 16, an (N−)-type drift region 18, an N-type buffer region 20, a (P+)-type collector region 22, and an (N+)-type cathode region 72.

An N-type region, an (N+)-type region, and an (N−)-type region may be formed by the ion implantation of phosphorus (P) or arsenic (As) as a dopant. The buffer region 20 may be formed by the ion implantation of either one of or both proton (H+) and selenium (Se) as dopants. A P-type region, a (P+)-type region, and a (P−)-type region may be formed by the ion implantation of boron (B) as a dopant.

In the A-A cross section, a mesa region 60-2 in the IGBT region 80 includes an emitter region 12, a base region 14, and an accumulation region 16. A boundary mesa region 61 includes a base region 14, a contact region 15, and an accumulation region 16. The contact region 15 is provided to a deeper position than the emitter region 12 from the upper surface 62. The base regions 14 are in contact to bottoms of the emitter region 12 and the contact region 15. The accumulation region 16 is located between the base region 14 and the drift region 18 in the depth direction of the semiconductor substrate 10. Each mesa region 60-1 in the FWD region 70 includes an anode region 13 and an accumulation region 16. The accumulation region 16 is in contact to a bottom of the anode region 13. The accumulation region 16 is located between the anode region 13 and the drift region 18 in the depth direction of the semiconductor substrate 10.

Each of the gate trench portions 40 of the present example includes a gate insulating film 42, a gate conductive portion 43, and a gate trench 44. The gate trench 44 may be formed by selectively etching the upper surface 62. The gate insulating film 42 may be in contact to an inner wall of the gate trench 44. The gate insulating film 42 may be formed by oxidizing or nitriding a semiconductor on the inner wall of the gate trench 44. The gate conductive portion 43 of the present example is provided inside the gate insulating film 42 by being contact to the gate insulating film 42. The gate insulating film 42 may insulate the gate conductive portion 43 from the semiconductor substrate 10. The gate conductive portion 43 may be made of a conducive material such as polysilicon.

Each of the dummy trench portions 30 of the present example includes a dummy trench insulating film 32, a dummy trench conductive portion 33, and a dummy trench 34. The dummy trench insulating film 32 and the dummy trench conductive portion 33 may be formed by the same method as the gate insulating film 42 and the gate conductive portion 43 respectively. Each trench portion may reach a drift region 18 by extending through the anode region 13, the base region 14, and the accumulation region 16.

The drift region 18 of the present example is located below the anode region 13 and the base region 14 in the semiconductor substrate 10. The drift region 18 and the buffer region 20 are provided over the FWD region 70 and the IGBT region 80. The drift region 18 and the buffer region 20 in the FWD region 70 may be regarded as a cathode of an FWD together with the cathode region 72.

The buffer region 20 may be located below the drift region 18. The buffer region 20 of the present example is located between the drift region 18, and the collector region 22 and the cathode region 72 in the Z-axis direction. The buffer region 20 may have a function of preventing a depletion layer that extends from a bottom of the base region 14 of the IGBT region 80 to the lower surface 64 from reaching the collector region 22 when a semiconductor device 200 is turned off. The buffer region 20 may be a field stop region in which an N-type doping concentration distribution has discrete peak values in the depth direction.

The collector region 22 and the cathode region 72 may be provided in a range of a predetermined depth from the lower surface 64 of the semiconductor substrate 10. In the present example, a position of an end of a lower surface side boundary 82 that is a boundary between the collector region 22 and the cathode region 72 in the negative X-axis direction matches a position of an upper surface side boundary 74 in the X-axis direction. Accordingly, in a cross section (A-A cross section) parallel to the X-Z plane inside an end of the cathode region 72 in the positive Y-axis direction, a collector region 22 is provided at a lower surface 64 side of the IGBT region 80 and a cathode region 72 is provided at a lower surface 64 side of the FWD region 70. The collector region 22 and the cathode region 72 are provided below the buffer region 20. An end of the cathode region 72 in the negative X-axis direction (lower surface side boundary 82) may not match the upper surface side boundary 74 and may retract to the FWD region 70 side. In this case, in a cross section parallel to the X-Z plane inside an end of the cathode region 72 in the positive Y-axis direction, a collector region 22 is provided at a lower surface 64 side of the IGBT region 80 and a collector region 22 and a cathode region 72 are provided to a lower surface 64 side of the FWD region 70. An end of the cathode region 72 in the negative X-axis direction may extend to the IGBT region 80 side. In this case, in a cross section parallel to the X-Z plane inside an end of the cathode region 72 in the positive Y-axis direction, a collector region 22 and a cathode region 72 are provided at a lower surface 64 side of the IGBT region 80 and a cathode region 72 is provided at a lower surface 64 side of the FWD region 70.

The IGBT region 80 of the present example includes the upper surface side boundary 74 in the positive X-axis direction. The IGBT region 80 may have the upper surface side boundary 74 with the FWD region 70 in the negative X-axis direction also. In the present example, a range of the IGBT region 80 in the X-axis direction is a range between two adjacent upper surface side boundaries 74. The FWD region 70 may be regarded as a region in the active region 100 other than the IGBT region 80.

Figure 4:
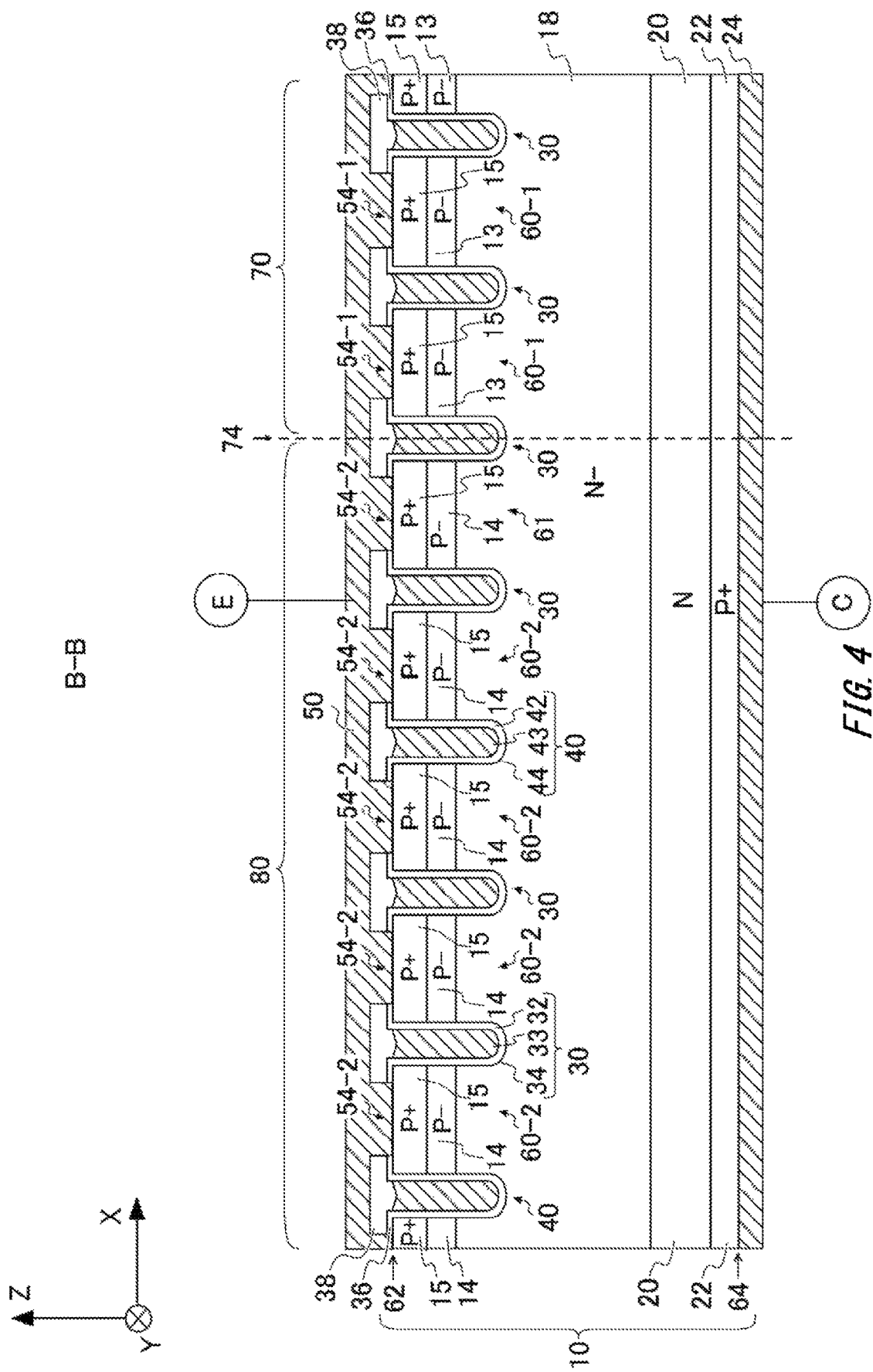
FIG. 4 illustrates the B-B cross section of FIG. 2.

FIG. 4 illustrates a B-B cross section in FIG. 2. The B-B cross section is parallel to the X-Z plane and is provided through between an end 55 of a contact portion 54 and an end 19 of an accumulation region 16 in the Y-axis direction. The B-B cross section is provided through the contact regions 15 in the FWD region 70 and the IGBT region 80. The B-B cross section is located closer in the positive Y-axis direction than from an end of a cathode region 72 in the positive Y-axis direction. Therefore, the B-B cross section does not include a cathode region 72 and a lower surface side boundary 82.

Figure 5:
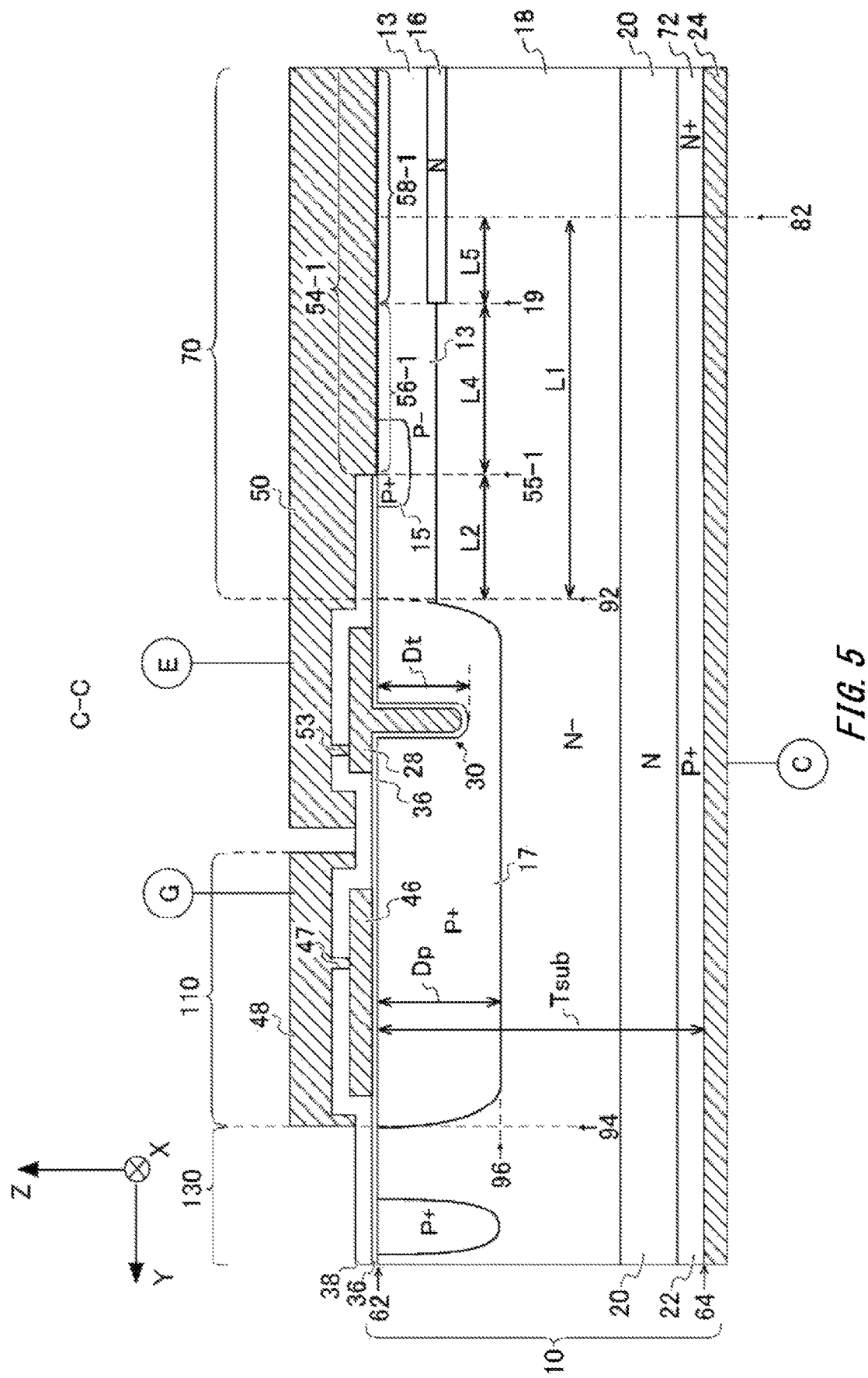
FIG. 5 illustrates the C-C cross section of FIG. 2.

FIG. 5 illustrates a C-C cross section in FIG. 2. The C-C cross section is parallel to a Y-Z plane and is provided through the FWD region 70 and the gate runner portion 110. The C-C cross section is particularly provided through a first contact portion 54-1 in the FWD region 70. A well region 17 located below the gate runner portion 110 may be in contact to the FWD region 70 in the Y-axis direction. In the C-C cross section, an inner end 92 is defined as an end of the well region 17 in the Y-axis direction opposite to an edge termination region 130.

In the present specification, an FWD region 70 is defined as a range inside the inner end 92 that is located inside the well region 17. The well region 17 is also provided below an extending gate runner portion 114. The FWD region 70 may be regarded as a range sandwiched between a well region 17 below an annular gate runner portion 112 and a well region 17 below the extending gate runner portion 114 in the Y-axis direction.

In the C-C cross section, a position of each of an inner end 92 of the well region 17, an end 55-1 of the first contact portion 54-1, an end 19 of the accumulation region 16, an end of the cathode region 72 (that is, lower surface side boundary 82) is projected on the upper surface 62 and illustrated by a dashed line. As illustrated in the figure, the inner end 92 of the well region 17, the lower surface side boundary 82 corresponding to an end of the cathode region 72, the end 19 of the accumulation region 16, and the end 55 of the contact portion 54 face one another in the Y-axis direction.

Holes may be accumulated in the well region 17. For example, holes implanted from a collector region 22 of an IGBT region 80 to a drift region 18 during an operation of an IGBT may be accumulated in the vicinity of a bottom 96 of a well region 17 adjacent to the IGBT region 80.

During a forward direction operation of the FWD region 70, the hole current flows from an anode region 13 toward a lower surface 64. This allows partial holes supplied to the drift region 18 flowing toward the lower surface 64 as hole currents and the accumulation of holes in the vicinity of the bottom 96 of the well region 17. However, in the present example, the lower surface side boundary 82 is separated from the inner end 92 of the well region 17. This allows reducing the amount of holes accumulated in the vicinity of the bottom 96 of the well region 17 adjacent to the FWD region 70 compared to the case where the lower surface side boundary 82 is located below the inner end 92 of the well region 17.

A semiconductor module mounted with an RC-IGBT usually includes an upper RC-IGBT configuring an upper arm and a lower RC-IGBT configuring a lower arm connected in series. The upper RC-IGBT and the lower RC-IGBT are individually turned on and turned off depending on operation modes. The FWD region 70 of the RC-IGBT is in a forward direction state for a predetermined time, and then in a reverse recovery state due to the above operations. In the reverse recovery state, the current flows in a direction opposite to the forward current. That is, in the reverse recovery state, holes flow in a direction substantially directed from the lower surface 64 toward an upper surface 62. Particularly, holes accumulated in the vicinity of the bottom 96 of the well region 17 may be extracted from the first contact portion 54-1 when the FWD region 70 is in the reverse recovery state. At this time, holes are likely to be concentrated in the vicinity of the end 55-1 of the first contact portion 54-1. A breakdown withstand capability of the FWD region 70 may be reduced by the concentration of hole currents in the vicinity of the end 55-1 when the FWD region 70 is in the reverse recovery state.

Therefore, in the present example, the lower surface side boundary 82 is retracted from the inner end 92 of the well region 17. This allows reducing the amount of holes accumulated in the vicinity of the bottom 96 of the well region 17, and accordingly reducing the concentration of hole currents in the vicinity of the end 55-1 of the first contact portion 54-1. In the present example, a first distance L1 is defined as the shortest distance when the inner end 92 of the well region 17 and the lower surface side boundary 82 are projected on the upper surface 62. The first distance L1 may be larger than a depth Dp from the upper surface 62 of the semiconductor substrate 10 to the bottom 96 of the well region 17 and may be smaller than a thickness Tsub from the upper surface 62 to the lower surface 64 of the semiconductor substrate 10.

The depth Dp may be larger than a depth Dt from the upper surface 62 to a bottom of a trench portion and may be smaller than half of the thickness Tsub of the semiconductor substrate 10. For example, the depth Dp is 10 μm or more and 20 μm or less. The thickness Tsub of the semiconductor substrate 10 may be determined depending on withstand voltages but may be, for example, 100 μm or more and 200 μm or less. The thickness Tsub of the present example is 110 μm.

The end 55-1 of the first contact portion 54-1 may be separated from the inner end 92 of the well region 17 because holes are likely to be concentrated in the vicinity of the end 55-1 of the first contact portion 54-1. As a result, holes move in the anode region 13 having a higher resistance than the well region 17 in a range from the bottom 96 to the vicinity of the end 55-1. Therefore, the concentration of holes in the vicinity of the end 55-1 can be reduced compared to when the end 55 and the inner end 92 match in the Y-axis direction. This can prevent the decrease in a breakdown withstand capability in the FWD region 70.

In the present example, the end 55-1 of the first contact portion 54-1 is located between the inner end 92 of the well region 17 and the lower surface side boundary 82. More specifically, the end 55-1 is located between the inner end 92 and the end 19 of the accumulation region 16. A second distance L2 that is the shortest distance when the inner end 92 of the well region 17 and the end 55-1 of the first contact portion 54-1 are projected on the upper surface 62 may be smaller than the first distance L1. In other words, the first distance L1 may be larger than the second distance L2. The second distance L2 may be 40% or more to 60% or less of the first distance L1 and may be smaller than half of the first distance L1. For example, the second distance L2 is several μm or more to 10 μm or less and the first distance L1 is several tens μm or more and 50 μm or less.

A fourth distance L4 that is the shortest distance when the end 55-1 of the first contact portion 54-1 and the end 19 of the accumulation region 16 are projected on the upper surface 62 may be larger than a fifth distance L5 that is the shortest distance when the end 19 of the accumulation region 16 and an end of the cathode region 72 are projected on the upper surface 62. This suppresses the prevention of the extraction of holes from the contact portion 54 by the accumulation region 16 and facilitates the extraction of carriers (in the present example, holes) to an emitter electrode 50 through the contact portion 54. The second distance L2 may be larger than the fifth distance L5. This can reduce the concentration of hole currents in the vicinity of the end 55-1 of the first contact portion 54-1 and ensure a breakdown withstand capability.

Figure 6:
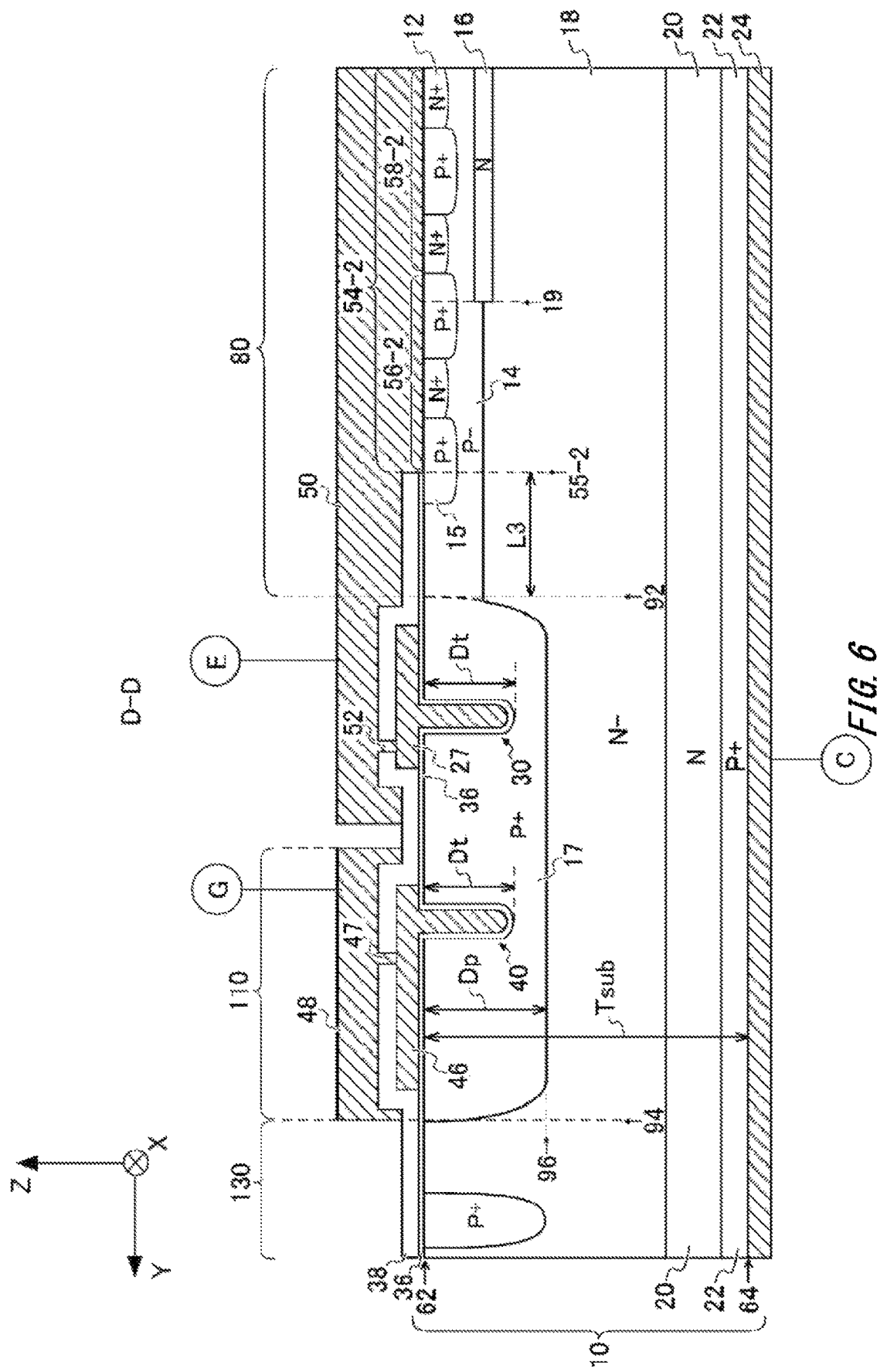
FIG. 6 illustrates the D-D cross section of FIG. 2.

FIG. 6 illustrates a D-D cross section in FIG. 2. The D-D cross section is parallel to a Y-Z plane and is provided through an IGBT region 80 and a gate runner portion 110. The D-D cross section is particularly provided through a second contact portion 54-2 in the IGBT region 80. A well region 17 may be in contact to the IGBT region 80 in the Y-axis direction. In the present specification, a range inside the inner end 92 of the well region 17 is defined as the IGBT region 80. A range sandwiched between a well region 17 below the annular gate runner portion 112 and a well region 17 below the extending gate runner portion 114 in the the Y-axis direction may be regarded as the IGBT region 80.

The D-D cross section is provided through a lateral portion of a gate trench portion 40 and a lateral portion of a dummy trench portion 30. Therefore, in the D-D cross section, the gate trench portion 40 and the dummy trench portion 30 are located within the well region 17. In the D-D cross section, positions of the inner end 92 of the well region 17 and the end 55-2 of the second contact portion 54-2 are projected on the upper surface 62 and illustrated by a dashed line. The shortest distance when the inner end 92 and the end 55-2 are projected on the upper surface 62 is defined as a third distance L3. In the present example, the third distance L3 is equal to the second distance L2, but in another example, the third distance L3 may be smaller than the second distance L2. A collector region 22 is provided at a lower surface 64 side of the IGBT region 80 instead of a cathode region 72.

Figure 7:
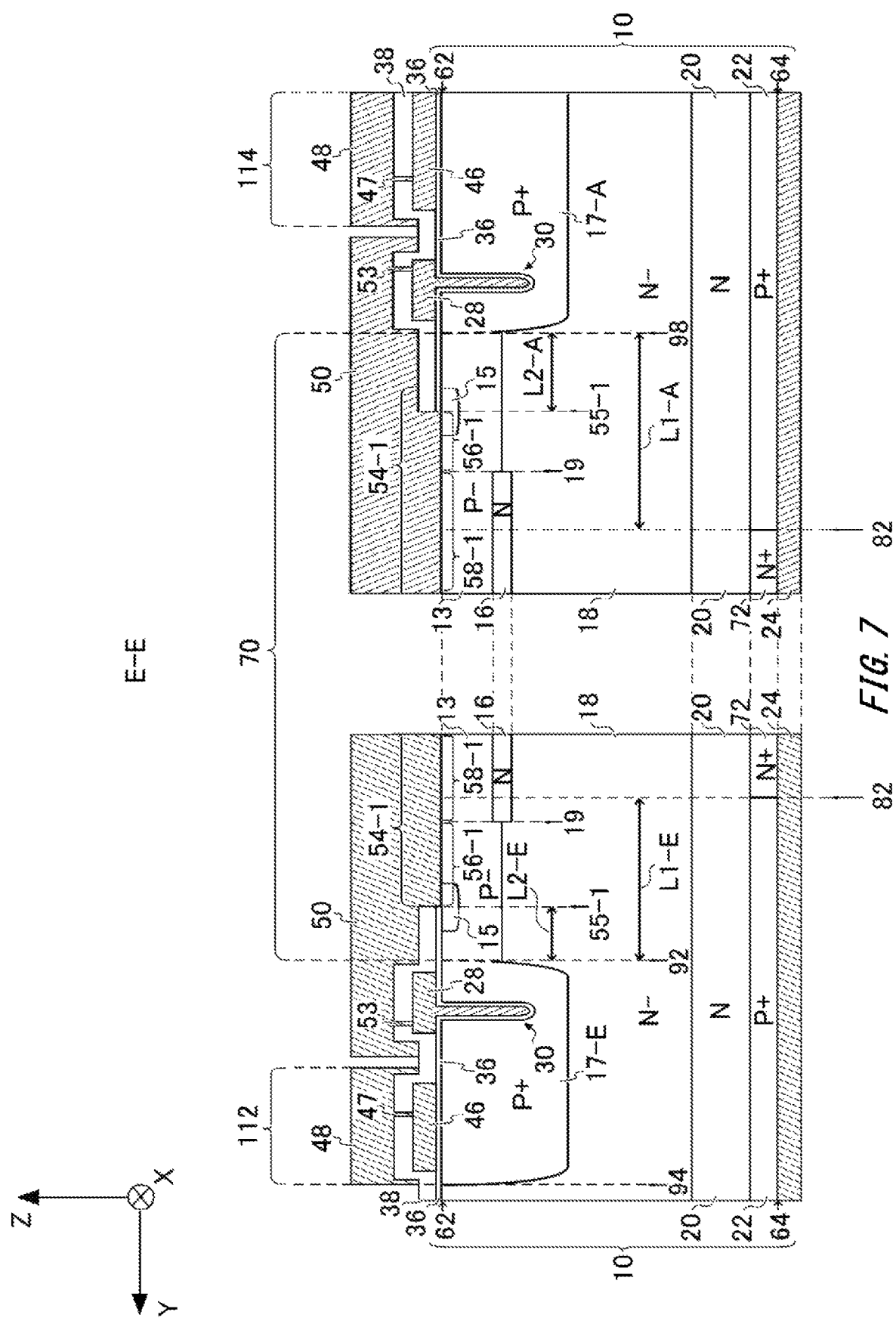
FIG. 7 illustrates the E-E cross section of FIG. 1.

FIG. 7 illustrates an E-E cross section in FIG. 1. The E-E cross section is parallel to a Y-Z plane and is provided through an annular gate runner portion 112, an FWD region 70, and an extending gate runner portion 114. Particularly, the E-E cross section is provided through first contact portions 54-1 in the FWD region 70 in an active region 100-1.

To facilitate understanding, in the E-E cross section, a well region 17 provided below the extending gate runner portion 114 is illustrated by a reference numeral 17-A and a well region 17 provided below the annular gate runner portion 112 is illustrated by a reference numeral 17-E. The first distance L1 and the second distance L2 defined by a well region 17-A are respectively illustrated by reference numerals L1-A and L2-A. That is, the shortest distance when an end 98 of the well region 17-A in the positive Y-axis direction and a lower surface side boundary 82 are projected on an upper surface 62 is defined as L1-A and the shortest distance when the end 98 of the well region 17-A and an end 55-1 of the contact portion 54-1 in the negative Y-axis direction are projected on the upper surface 62 is defined as L2-A. Similarly, the first distance L1 and the second distance L2 defined by a well region 17-E are respectively defined as L1-E and L2-E.

In an RC-IGBT, the disruption due to the current crowding is more likely to occur in the FWD region 70 than in the IGBT region 80. The disruption is more likely to occur in the FWD region 70 in the vicinity of the extending gate runner portion 114 than in the vicinity of the annular gate runner portion 112 that is in contact to the edge termination region 130. Therefore, the first distance L1-A in the vicinity of the extending gate runner portion 114 may be larger than the first distance L1-E in the vicinity of the annular gate runner portion 112 (L1-E<L1-A). Further, the second distance L2-A may be larger than the second distance L2-E (L2-E<L2-A). This allows preventing the disruption that is relatively likely to occur due to the current crowding at an end 55-1 of a first contact portion 54-1 in the vicinity of the extending gate runner portion 114.

Figure 8:
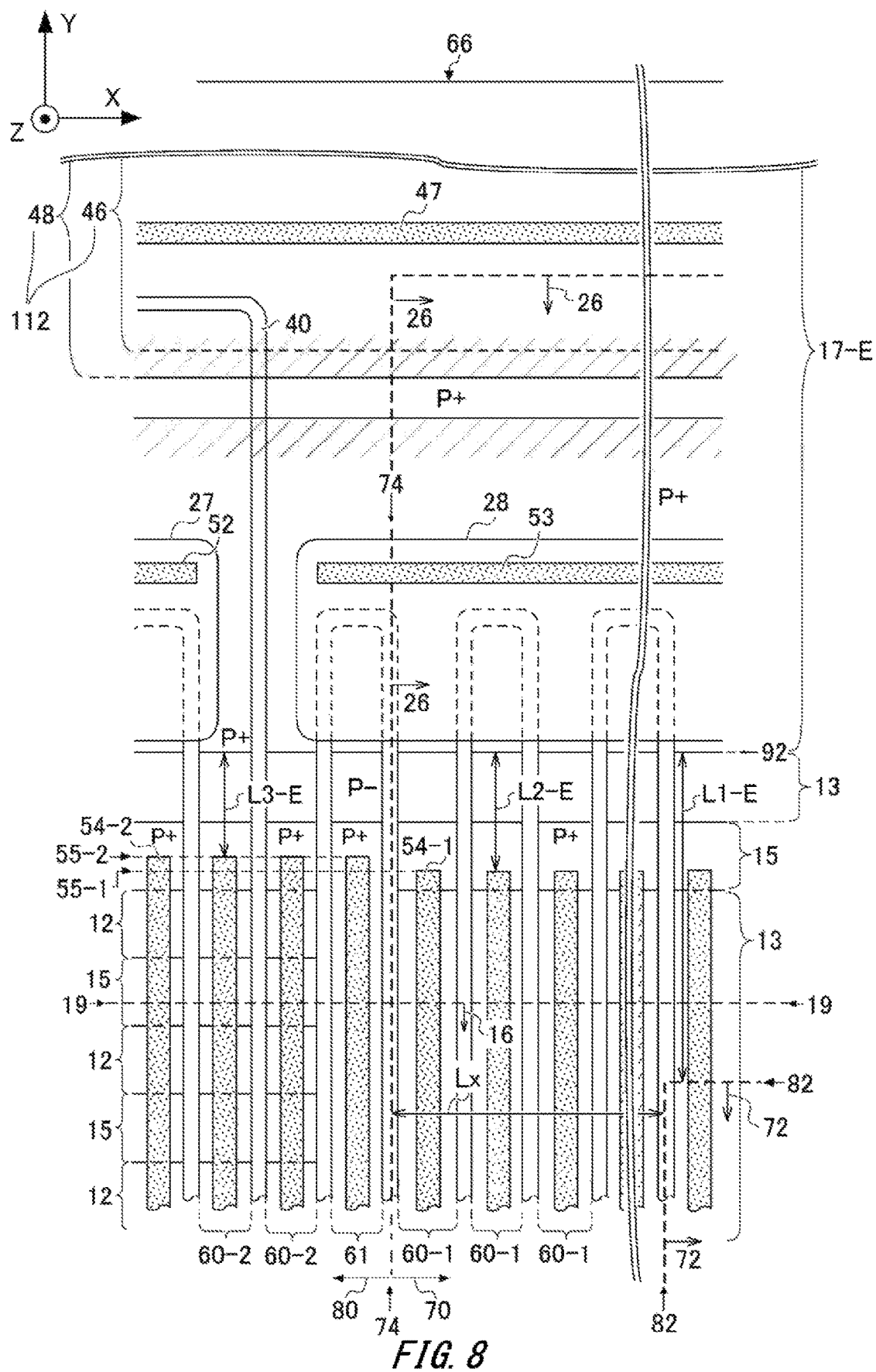
FIG. 8 is a top plan enlarged view of the vicinity of an annular gate runner portion 112 according to a first modification example.

FIG. 8 is a top plan enlarged view of the vicinity of an annular gate runner portion 112 in a first modification example. In the present example, a third distance L3-E is smaller than the second distance L2-E. That is, in the present example, the end 55-1 of the first contact portion 54-1 in the FWD region 70 is separated further from the well region 17-E than the end 55-2 of the second contact portion 54-2 in the IGBT region 80. This allows widening an effective region that operates as an IGBT in the IGBT region 80 compared with that in the first embodiment while improving the breakdown withstand capability in the FWD region 70.

A lower surface side boundary 82 of the present example is located closer to the FWD region 70 side than an upper surface side boundary 74 in the X-axis direction. That is, in the present example, an end of a cathode region 72 in the negative X-axis direction is separated from the upper surface side boundary 74 by a first retracted length Lx. The first retracted length Lx is a length from the lower surface side boundary 82 to the upper surface side boundary 74 in the X-axis direction. The first retracted length Lx may be equal to or greater than the first distance L1-E from the inner end 92 of the well region 17 to an end of the cathode region 72 closest to an outer peripheral end 66 in the Y-axis direction. The first retracted length Lx of the cathode region 72 may be several tens μm or more to several hundreds of μm or less. In the present example, the first retracted length Lx is 100 μm. The breakdown withstand capability in the FWD region 70 can be further improved by retracting the cathode region 72 in the X-axis direction also in addition to the Y-axis direction. The first retracted length Lx is a length from the lower surface side boundary 82 to the upper surface side boundary 74 in the X-axis direction and the upper surface side boundary 74 is located within the active region 100. On the other hand, the first distance L1-E is a length from the inner end 92 of the well region 17 to an end of the cathode region 72 closest to the outer peripheral end 66 in the Y-axis direction and a position of the inner end 92 of the well region 17 corresponds to a position of an end of the active region 100. From a difference in positions in the active region 100, as the retraction amount, the first retracted length Lx is set to be equal to or greater than the first distance L1-E.

A semiconductor substrate 10 of the present example includes a lifetime killer region 26 in the FWD region 70. The lifetime killer region 26 may be a point detect (a vacancy in multi-vacancy, a dangling bond or the like) area formed in the semiconductor substrate 10 by introducing impurities such as helium (He). The lifetime killer region 26 may include the impurity itself introduced for forming the point detect The lifetime killer region 26 may include recombination centers of the carriers that are formed in the semiconductor substrate 10 by at least one of the point defects and the impurities. This allows reducing the number of carriers (for example, holes) per unit time at the time of reverse recovery compared with when the lifetime killer region 26 is not provided. Therefore, a breakdown withstand capability in the FWD region 70 can be improved.

The lifetime killer region 26 of the present example is provided in a wider range than the cathode region 72 as seen from above. In the present example, an end of the lifetime killer region 26 in the negative X-axis direction matches the upper surface side boundary 74. On the other hand, an end of the lifetime killer region 26 in the positive Y-axis direction is provided below the gate runner portion 110 by going beyond an end of the FWD region 70 in the positive Y-axis direction.

However, if the lifetime killer region 26 reaches the outer peripheral end 66 of the semiconductor substrate 10, a leak current may flow via the lifetime killer region 26. Therefore, the lifetime killer region 26 may be provided below the annular gate runner portion 112 in correspondence to a part of the length of the annular gate runner portion 112 in the Y-axis direction. In the present example, an end of the lifetime killer region 26 in the positive Y-axis direction is located between an inner end 92 and an outer end 94 of the well region 17. The lifetime killer region 26 of the present example can effectively reduce the concentration of holes accumulated in the well region 17-E in the first contact portion 54-1. Therefore, a breakdown withstand capability in the FWD region 70 can be improved.

The lifetime killer region 26 may be provided in the IGBT region 80 also in addition to the FWD region 70. The lifetime killer region 26 may extend from the FWD region 70 in the X-axis direction up to a boundary mesa region 61 or a mesa region 60-2 at the boundary mesa region 61 side in the IGBT region 80.

Figure 9:
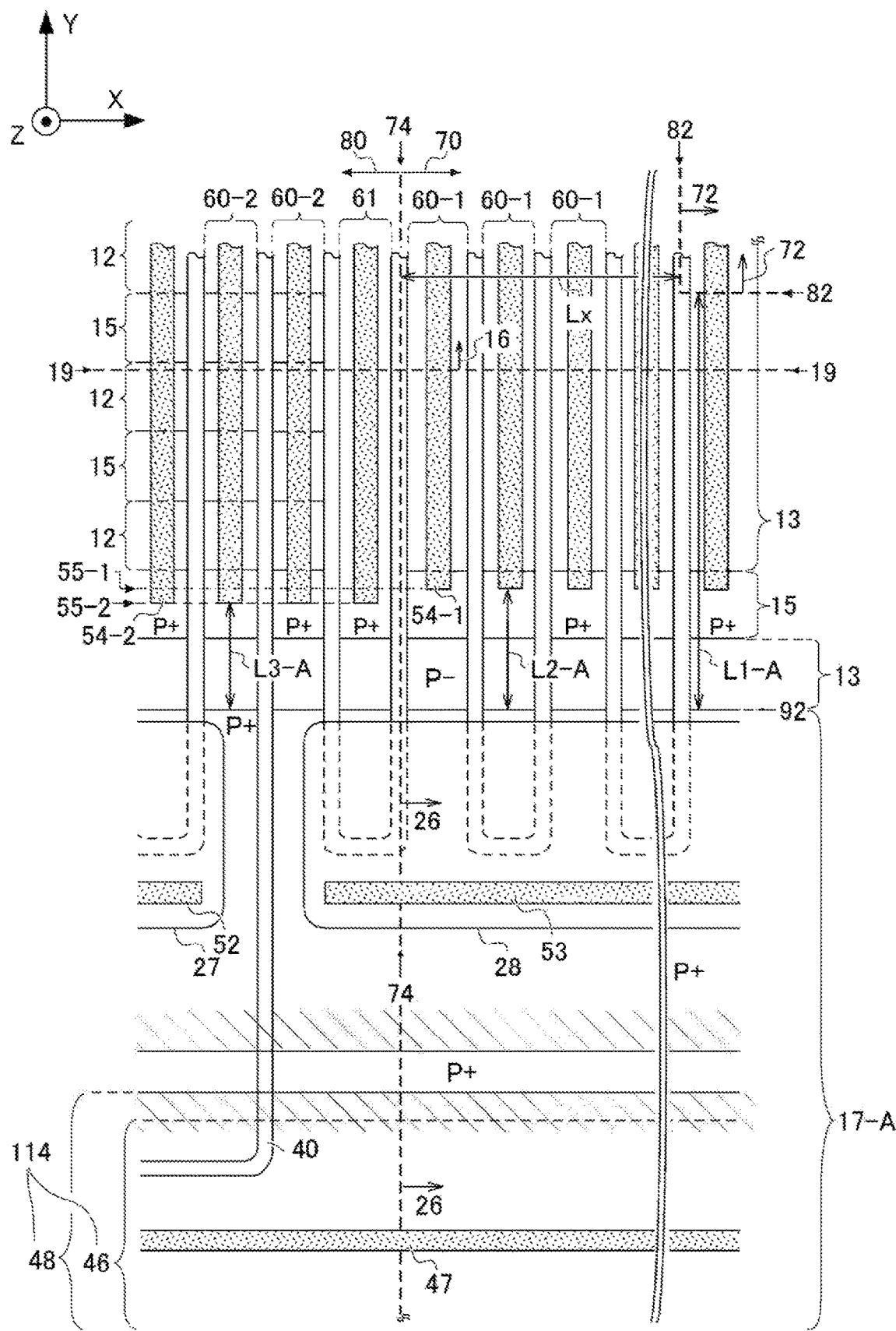
FIG. 9 is a top plan enlarged view of the vicinity of an extending gate runner portion 114 according to the first modification example.

FIG. 9 is a top plan enlarged view of the vicinity of an extending gate runner portion 114 in the first modification example. In the present example, a third distance L3-A is smaller than a second distance L2-A. The lifetime killer region 26 may be provided over an entire length of the extending gate runner portion 114 in the Y-axis direction below the extending gate runner portion 114 located between active regions 100-1 and 100-2. Therefore, in the present example, it is possible to reduce the amount of carriers directed from the entire well region 17-A that is a boundary region between the active regions 100-1 and 100-2 to the first contact portion 54-1 while surely preventing the leak current at the outer peripheral end 66 of the semiconductor substrate 10.

An end 19 of an accumulation region 16 in the negative Y-axis direction may be separate from an end 55 of a contact portion 54 by a length of several μm or more to 20 μm or less. In the present example, the end 19 of the accumulation region 16 in the negative Y-axis direction is located below a second emitter region 12 from an end in the negative Y-axis direction in the active region 100-1. The lifetime killer region 26 may be provided to overlap an entire (P+)-type well region 17 below a gate pad portion 120 although not illustrated in the figure. However, as described above, to prevent the leak current, the lifetime killer region 26 preferably does not reach the outer peripheral end 66. The breakdown withstand capability in the FWD region 70 can be improved by the well region 17 and the lifetime killer region 26 being overlapped in the depth direction as much as possible.

Figure 10:
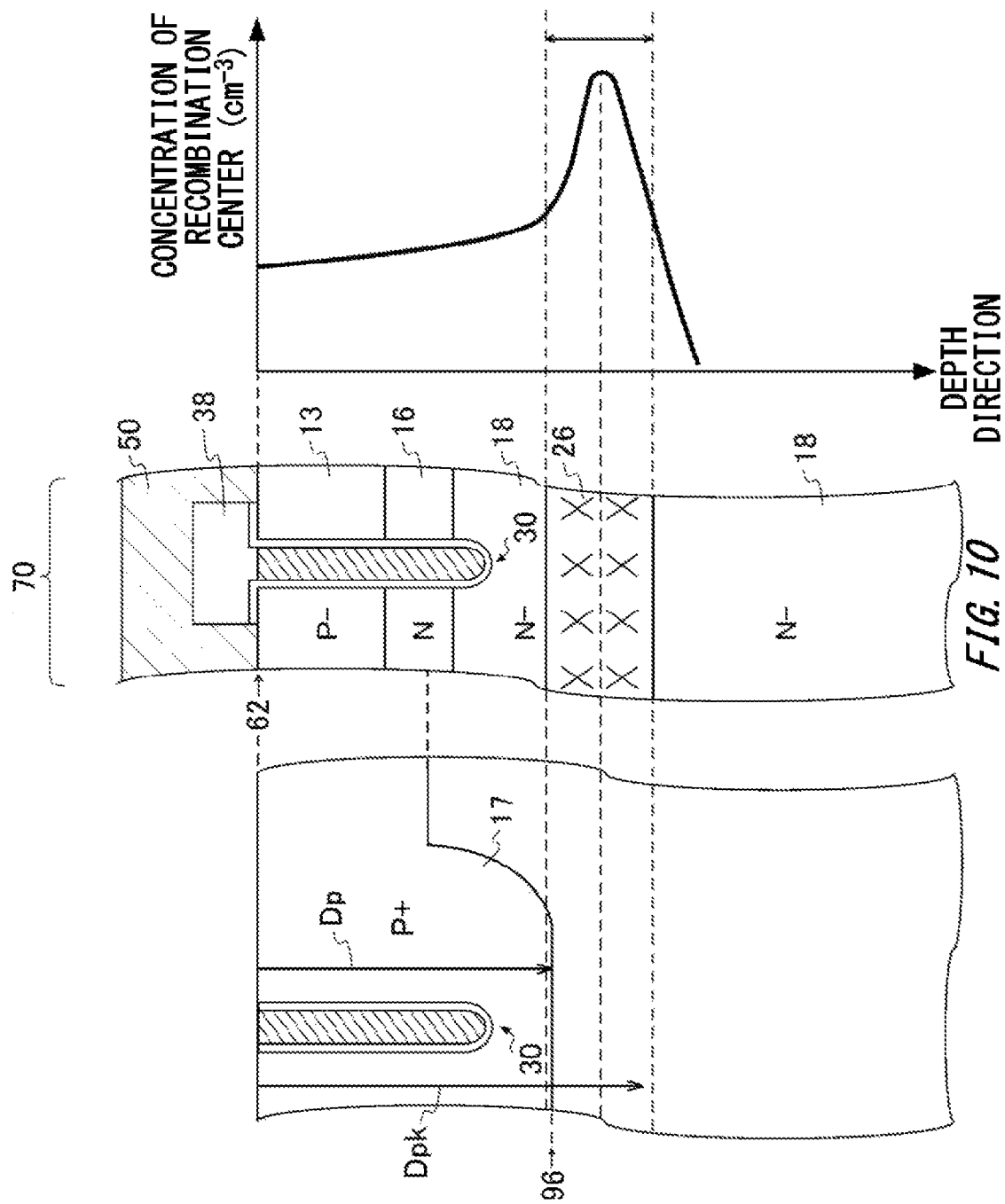
FIG. 10 illustrates the concentration distribution of the recombination center of a lifetime killer region 26 in the depth direction.

FIG. 10 illustrates the concentration distribution of the recombination center of a lifetime killer region 26 in the depth direction. FIG. 10 illustrates at the center, a partial A-A cross section in the FWD region 70 and illustrates at a left side, a partial C-C cross section in the FWD region 70. FIG. 10 illustrates at a right side, the concentration distribution (cm$^{-3}$) of the recombination center in the depth direction. The recombination center concentration may be read as the lifetime killer concentration. The lifetime killer region 26 may have a concentration distribution peak of the lifetime killer at a position closer to a lower surface 64 of a semiconductor substrate 10 than a bottom 96 of a well region 17 as illustrated in the figure.

For example, by the ion implantation of He at an acceleration energy of 24 MeV from an upper surface 62, it is possible to form a lifetime killer concentration distribution in which a peak depth position Dpk from the upper surface 62 is 18 μm and s a half width is 10 In this case, the depth Dp from the upper surface 62 to the bottom 96 of the well region 17 is, for example, 10 By forming the lifetime killer region 26 at a deeper position than the well region 17, it is possible to reduce the amount of holes accumulated in the well region 17 when the FWD region 70 is in a forward direction state. This allows improving the breakdown withstand capability of the FWD region 70 at the time of reverse recovery.

Figure 11:
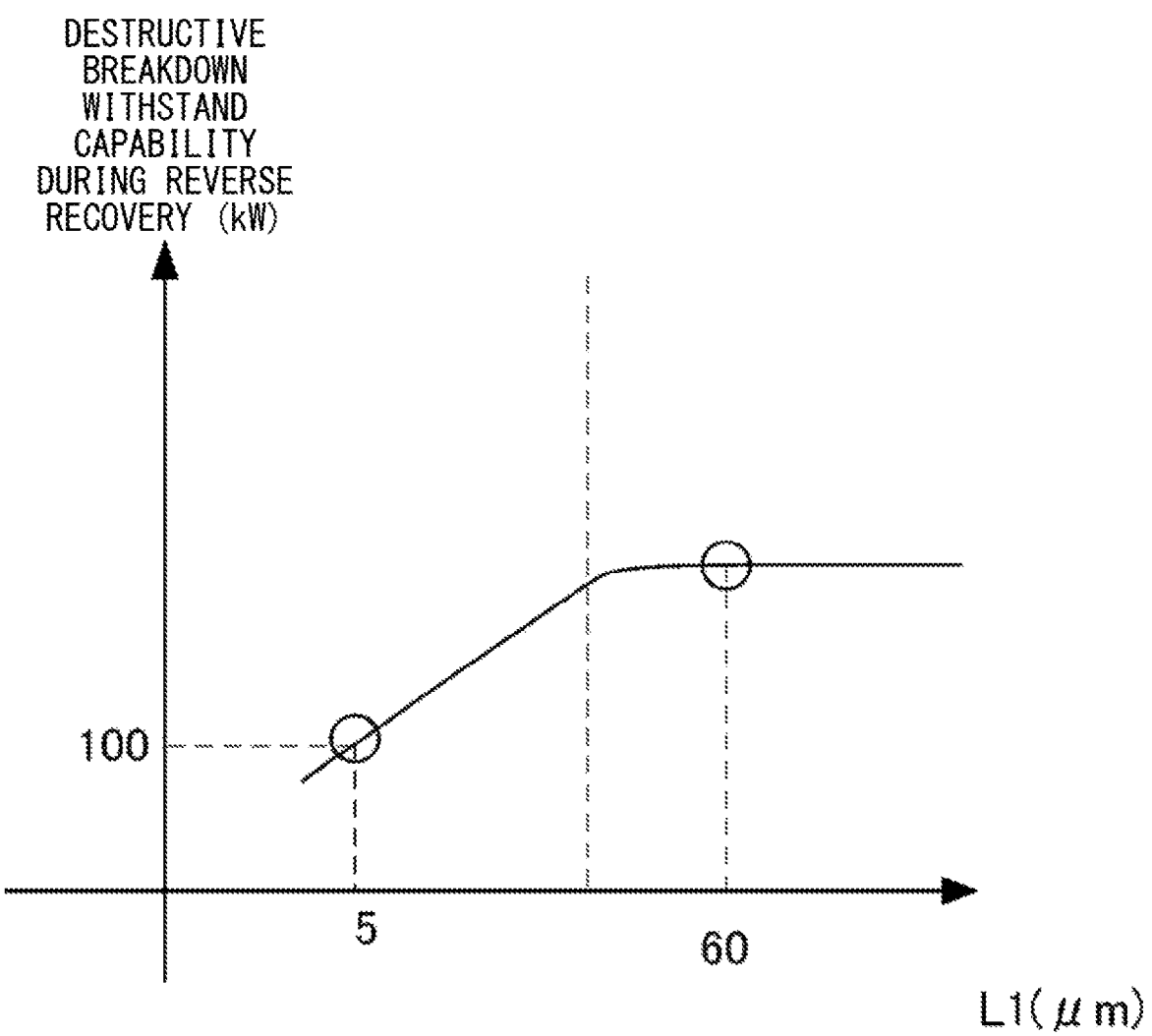
FIG. 11 illustrates the breakdown withstand capability of the FWD region 70 at the time of reverse recovery relative to a first distance L1.
Each of (a) to (d) of FIG. 12 illustrates the positional relationship between a contact portion 54 and an accumulation region 16.

FIG. 11 illustrates the breakdown withstand capability of the FWD region 70 at the time of reverse recovery relative to a first distance L1. A vertical axis represents the breakdown withstand capability (kW) at the time of reverse recovery. A horizontal axis represents a first distance L1 (μm) from the inner end 92 of the well region 17 to the lower surface side boundary 82 in the FWD region 70 (see C-C cross section in FIG. 5). As illustrated in FIG. 11, as the first distance L1 increases, the breakdown withstand capability at the time of reverse recovery becomes high.

Table 1 represents other experimental results when the power supply voltage Vcc=800 V, a junction temperature of the semiconductor substrate 10=150° C., a thickness Tsub of the semiconductor substrate 10=110 and the width of the FWD region 70 in the X-axis direction=200 In this experiment, an Irp (reverse-recovery peak current) in which the disruption occurs in a semiconductor device 200 is measured by changing the Irp flowing in the FWD region 70 relative to a predetermined first distance L1. In Table 1, a symbol "○" represents that the semiconductor device 200 is not disrupted (non-disruption) and a symbol "x" represents that the semiconductor device 200 is disrupted respectively. Provision of two columns for each of the distance L1=10 μm and the distance L1=30 μm means that two measurements are performed for each of the distance L1=10 μm and the distance L1=30 μm. This experiment also reveals that as the first distance L1 increases, the breakdown withstand capability at the time of reverse recovery becomes high.

TABLE 1

| | Distance 1 Distance between well region 17 and cathode region 72 | | | |
|---|---|---|---|---|
| Irp | 10 μm | | 30 μm | |
| 150 | ○ | ○ | ○ | ○ |
| 200 | ○ | ○ | ○ | ○ |
| 250 | ○ | ○ | ○ | ○ |
| 300 | ○ | ○ | ○ | ○ |
| 400 | x | ○ | ○ | ○ |
| 500 | | x | ○ | ○ |
| 600 | | | ○ | ○ |
| 700 | | | ○ | ○ |
| 800 | | | ○ | ○ |
| 900 | | | ○ | ○ |
| 1000 | | | ○ | ○ |
| 1100 | | | ○ | ○ |
| 1200 | | | x | x |

Figure 12:
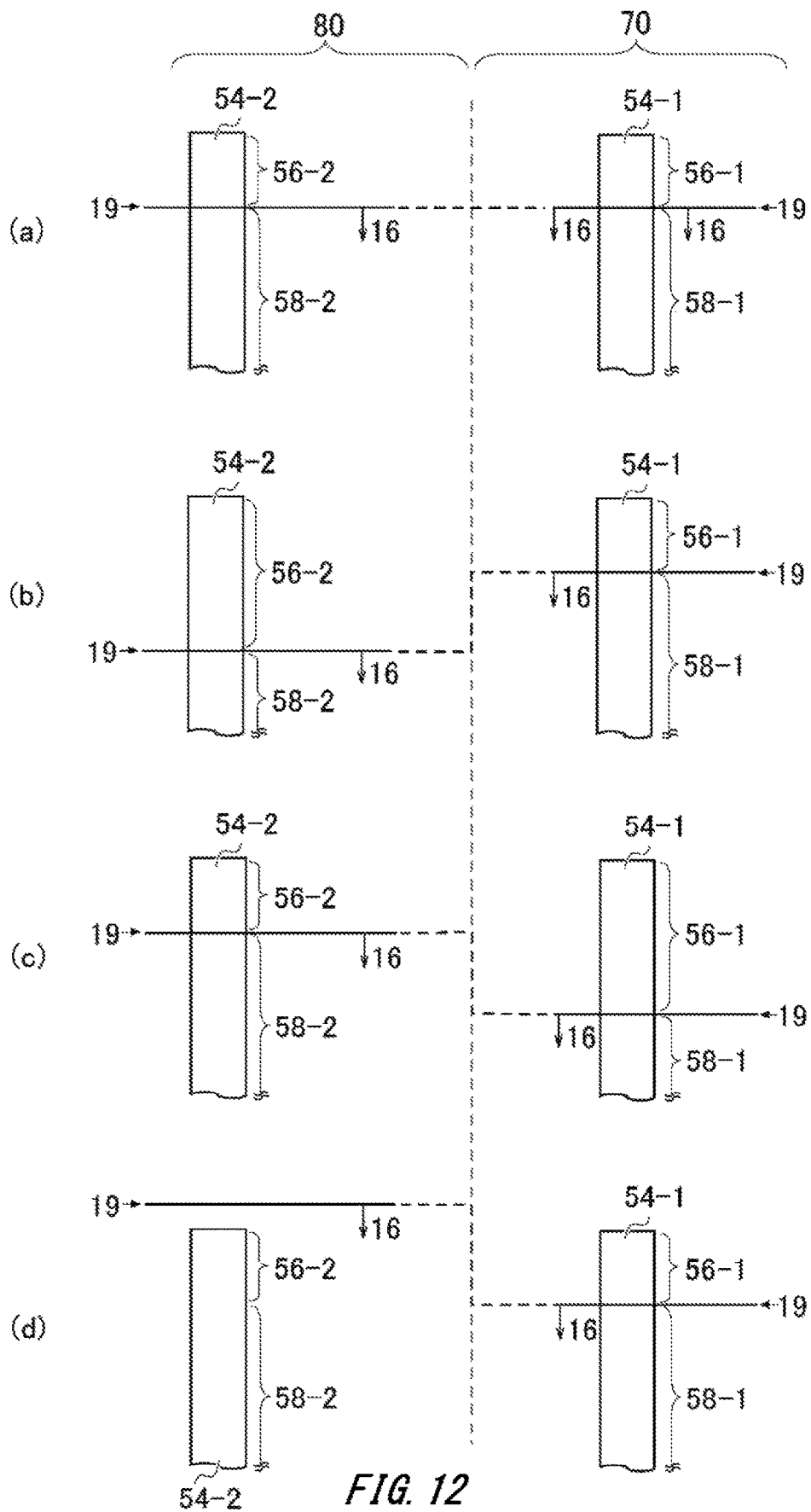

Each of (a) to (d) in FIG. 12 illustrates a positional relationship between the contact portion 54 and the accumulation region 16. FIG. 12 illustrates the FWD region 70 annular gate runner portion and the IGBT region 80 in the vicinity of the annular gate runner portion 112. In all of (a) to (d) in FIG. 12, a positional relationship between a first contact portion 54-1 and an end 19 of an accumulation region 16 in the FWD region 70 is illustrated at a right side and a positional relationship between a second contact portion 54-2 and an end 19 of an accumulation region 16 in the IGBT region 80 is illustrated at a left side.

The (a) in FIG. 12 corresponds to the first embodiment illustrated in FIG. 2. On the other hand, in (b) to (d) in FIG. 12, positions of the end 19 of the accumulation region 16 differ depending on the FWD region 70 and the IGBT region 80. Therefore, a length of a first non-overlapping region 56-1 differs from a length of a second non-overlapping region 56-2 in the Y-axis direction. A length of a non-overlapping region 56 in the Y-axis direction corresponds to the fourth distance L4 illustrated in the C-C cross section.

In (b) of FIG. 12, a length of a first non-overlapping region 56-1 in the Y-axis direction is smaller than a length of a second non-overlapping region 56-2 in the Y-axis direction. On the other hand, in (c) and (d) of FIG. 12, a length of a first non-overlapping region 56-1 in the Y-axis direction is larger than a length of a second non-overlapping region 56-2 in the Y-axis direction. This allows expanding a range in (c) and (d) of FIG. 12 in which the breakdown withstand capability in the FWD region 70 at the time of reverse recovery is secured and an IE effect can be obtained in the IGBT region 80 than a range in examples of (a) and (b) in FIG. 12.

In an example of (d) in FIG. 12, the IGBT region 80 is an IGBT region 80-C corresponding to an inner transistor region. An end 19 of an accumulation region 16 in the IGBT region 80-C in the Y-axis direction may be closer to the outer peripheral end 66 of the semiconductor substrate 10 than an end 55-2 of a second contact portion 54-2 in the Y-axis direction. In (d) of FIG. 12, the accumulation region 16 is provided in a wider range than the second contact portion 54-2. This allows obtaining a higher IE effect in the IGBT region 80 than that in an example of (c) of FIG. 12.

Figure 13:
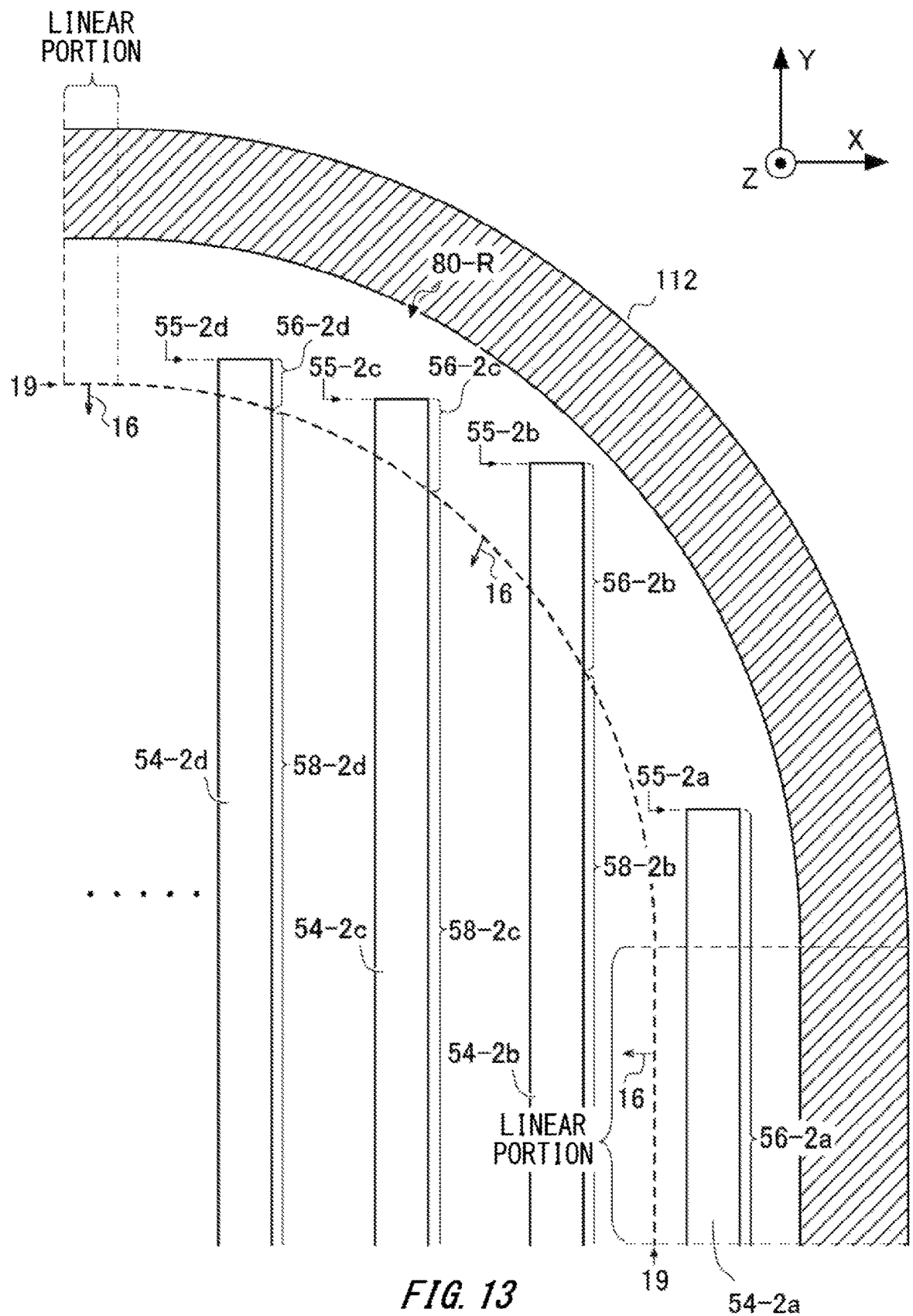
FIG. 13 is an enlarged view of the region B of FIG. 1.

FIG. 13 is an enlarged view of the region B in FIG. 1. The region B is a region having the vicinity of an end in each of the positive X-axis direction and the positive Y-axis direction in an IGBT region 80-R. In FIG. 13, four second contact portions 54-2 close to the outer peripheral end 66 of the semiconductor substrate 10 in the IGBT region 80-R are illustrated by reference numerals 54-2a to 54-2d. The second contact portion 54-2a is closest to the outer peripheral end 66 of the semiconductor substrate 10 in the X-axis direction. The IGBT region 80-R is one example of an outer transistor region at an end of an active region 100 in the X-axis direction.

Each of the second contact portions 54-2 in the IGBT region 80-R also has a second non-overlapping region 56-2 as similar to the IGBT region 80-C. However, in the IGBT region 80-R, a length of the second non-overlapping region 56-2 in the Y-axis direction becomes longer as it is closer to the outer peripheral end 66 of the semiconductor substrate 10 in the X-axis direction.

In the present example, an accumulation region 16 in the IGBT region 80-R has a corner with the curvature. In the present example, a curved portion at an end 19 of the accumulation region 16 is across the second contact portions 54-2b, 54-2c and 54-2d. Therefore, a length of the second non-overlapping region 56-2 in the Y-axis direction may be equal to a length of a second non-overlapping region 56-2 in the Y-axis direction at an end 55-2 of each of the second contact portions 54-2 in the positive X-axis direction.

Alternatively, a length of the second non-overlapping region 56-2 in the Y-axis direction may be equal to a length of a second non-overlapping region 56-2 in the Y-axis direction at an end 55-2 of each of the second contact portions 54-2 in the negative X-axis direction or may be equal to a length of a second non-overlapping region 56-2 in the Y-axis direction at the center of each of the second contact portions 54-2 in the X-axis direction. Whichever definition is used, in the present example, a length of a second non-overlapping region 56-2 in the Y-axis direction becomes large in the order of the second non-overlapping region 56-2a, the second non-overlapping region 56-2b, the second non-overlapping region 56-2-c and the second non-overlapping region 56-2-d.

Particularly, the entire second contact portion 54-2a does not overlap with the accumulation region 16. This allows extracting holes accumulated in the well region 17 below the annular gate runner portion 112 from the second contact portion 54-2a. Therefore, the amount of holes entering to the FWD region 70 from the IGBT region 80 in a turning manner can be reduced compared to when the second contact portion 54-2a and the accumulation region 16 are overlapped in the Z-axis direction.

Figure 14:
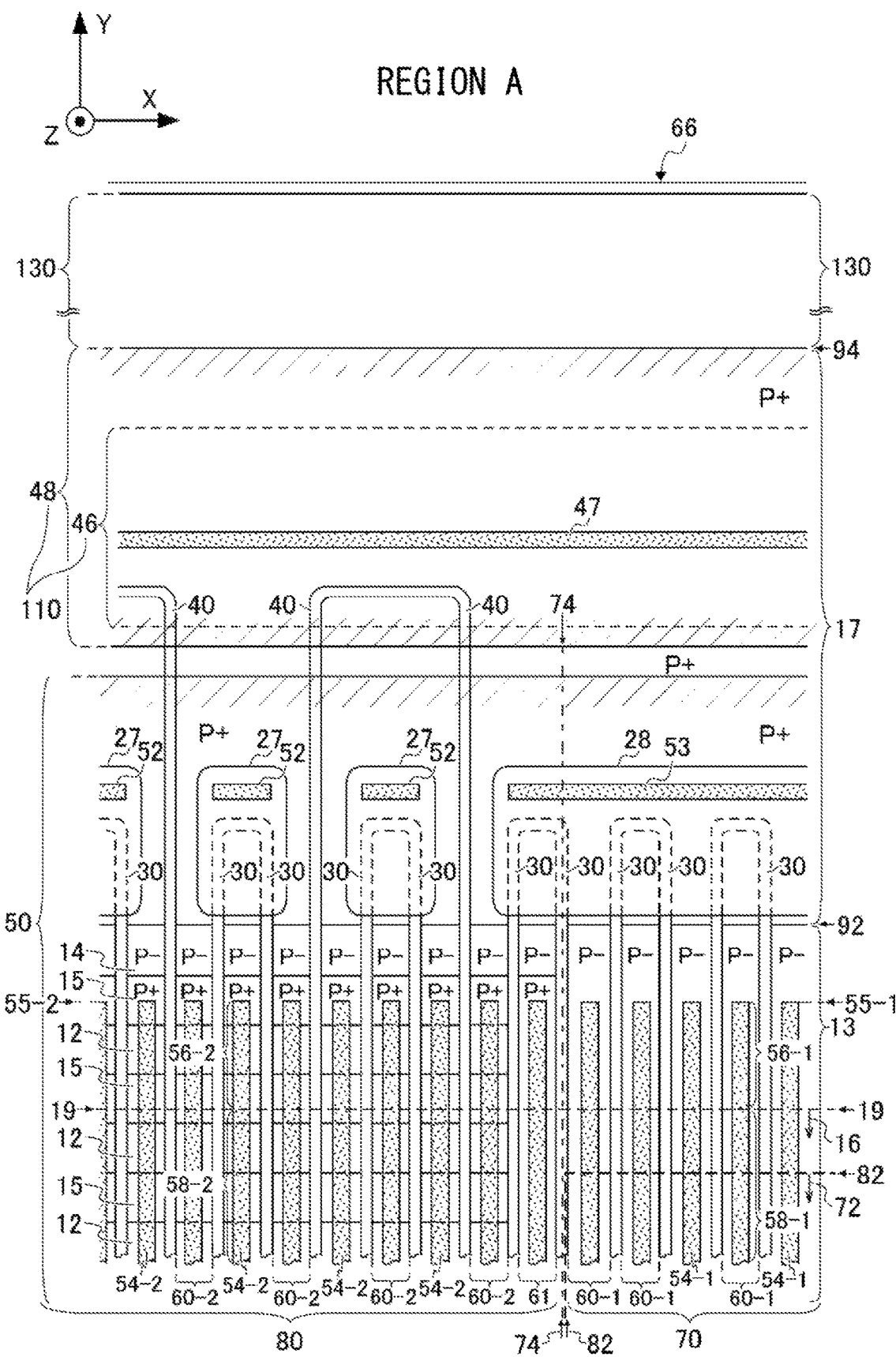
FIG. 14 is an enlarged view of the region A of FIG. 1 in the second embodiment.

FIG. 14 is an enlarged view of the region A in FIG. 1 of the second embodiment. In a FWD region 70 of the present example, at least one of mesa regions 60-1 does not include a (P+)-type contact region 15 at a position where ends 55-1 of first contact portions 54-1 in the Y-axis direction and the mesa regions 60-1 overlap. The present embodiment is different from the first embodiment in the above point. The remaining points of the present embodiment are the same as those in the first embodiment and the modification example thereof. Particularly, in the present example, the all mesa regions 60-1 in the FWD region 70 do not include a (P+)-type contact region 15 below the ends 55-1.

As in the first embodiment, if a contact region 15 having a predetermined length in the Y-axis direction is provided in each of the mesa regions 60-1, the concentration of carriers at the ends 55-1 of the contact portions 54-1 can be prevented to some extent. However, this is likely to increase an Irp because carriers at the anode side are locally increased by providing a contact region 15 in each of the mesa regions 60-1. Therefore, in the present example, a contact region 15 is not provided in at least one mesa region 60-1. This allows more suppressing an Irp than in the first embodiment.

However, the IGBT region 80 has a parasitic thyristor structure (N-P-N-P structure). The N-P-N-P structure of the present example includes an (N+)-type emitter region 12, a (P−)-type base region 14, a (P+)-type contact region 15, an N-type accumulation region 16, an (N−)-type drift region 18, an N-type buffer region 20, and a (P+)-type collector region 22. If the (P+)-type contact region 15 is used as the (P−)-type base region 14, a problem is caused that the latch-up is likely to occur.

Therefore, in the IGBT region 80 of the present example, contact regions 15 located in the vicinity of ends of the mesa regions 60-2 in the positive Y-axis direction are intentionally left. That is, in the IGBT region 80 of the present example, at least one of mesa regions 60-2 includes a contact region 15 at a position where ends 55-2 of second contact portions 54-2 in the Y-axis direction and at least one of the mesa regions 60-2 overlap. Particularly, in the present example, the all mesa regions 60-2 in the IGBT region 80 include (P+)-type contact regions 15 below the ends 55-2. This can suppress the occurrence of latch-up in an IGBT region.

Figure 15:
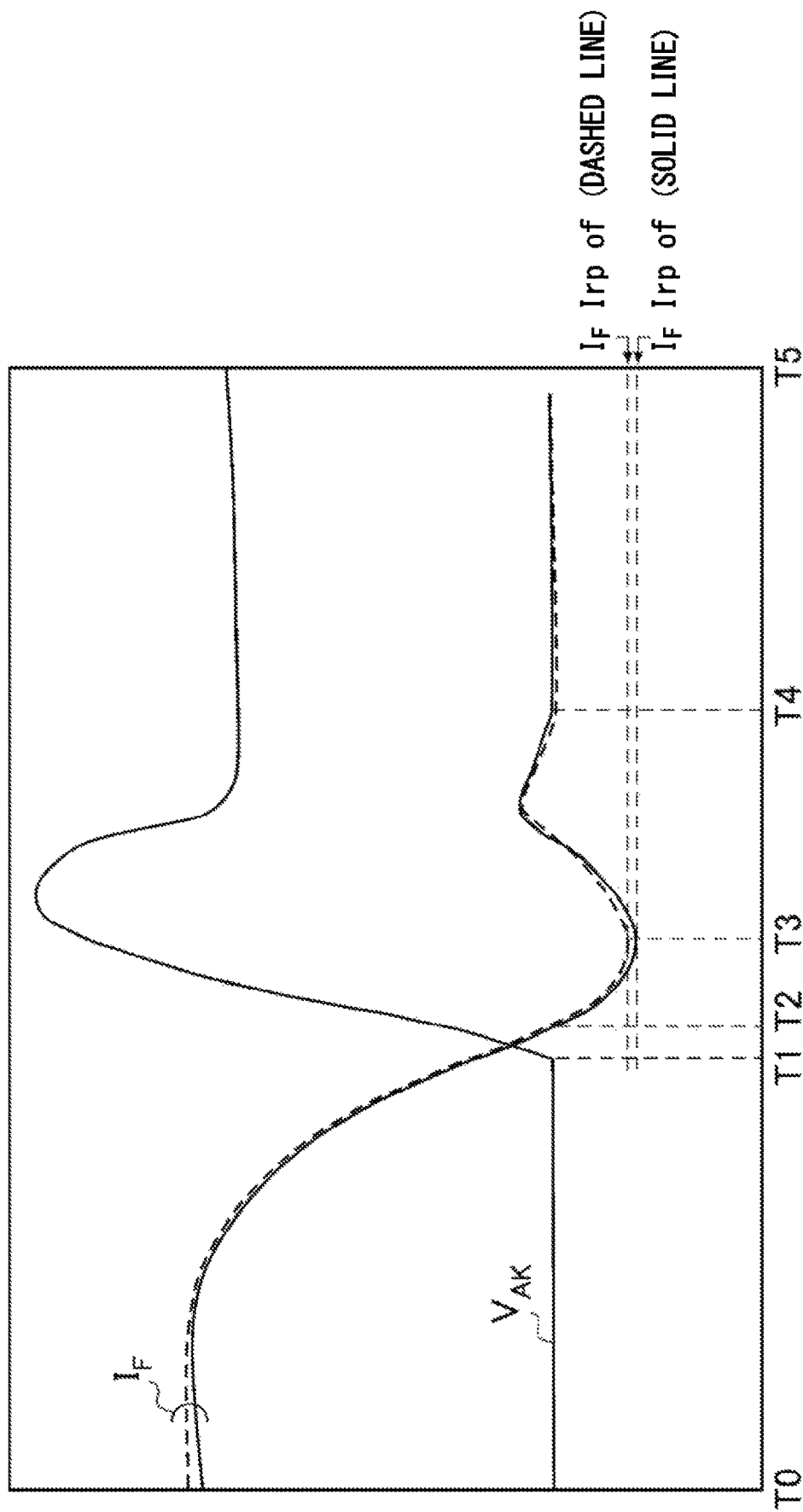
FIG. 15 illustrates simulation results of variations over time of an anode-cathode voltage ($V_{AK}$) and the current ($I_F$) in a FWD region 70.

FIG. 15 shows simulation results of variations over time of an anode-cathode voltage ($V_{AK}$) and the current ($I_F$) in a FWD region 70. The vertical axis represents the anode-cathode voltage ($V_{AK}$) and the current ($I_F$). The horizontal axis represents time. Descriptions are made below by regarding a plurality of FWD regions 70 in a single RC-IGBT collectively as an FWD that is a functional element and similarly regarding a plurality of IGBT regions 80 collectively as an IGBT that is a functional element. An emitter electrode 50 of the IGBT is common with an anode electrode of the FWD and a collector electrode 24 of the IGBT is common with a cathode electrode of the FWD.

During a time period from time T0 to T1, the freewheeling current flows through the FWD in the forward direction (direction from anode to cathode). Then, the graph reveals the reverse recovery of $I_F$ of the FWD at time T2, and at time T3, $I_F$ of the FWD becomes Irp. Then, at time T4, the $I_F$ gradually approaches substantial zero and at time T5, becomes zero. In FIG. 15, the $I_F$ in the first embodiment is illustrated by a dashed line and the $I_F$ in the second embodiment is illustrated by a solid line. The Irp can be more suppressed in the second embodiment than in the first embodiment. The $V_{AK}$ during a time period from time T0 to T5 is the same both in the first embodiment (dashed line) and the second embodiment (solid line).

Figure 16:
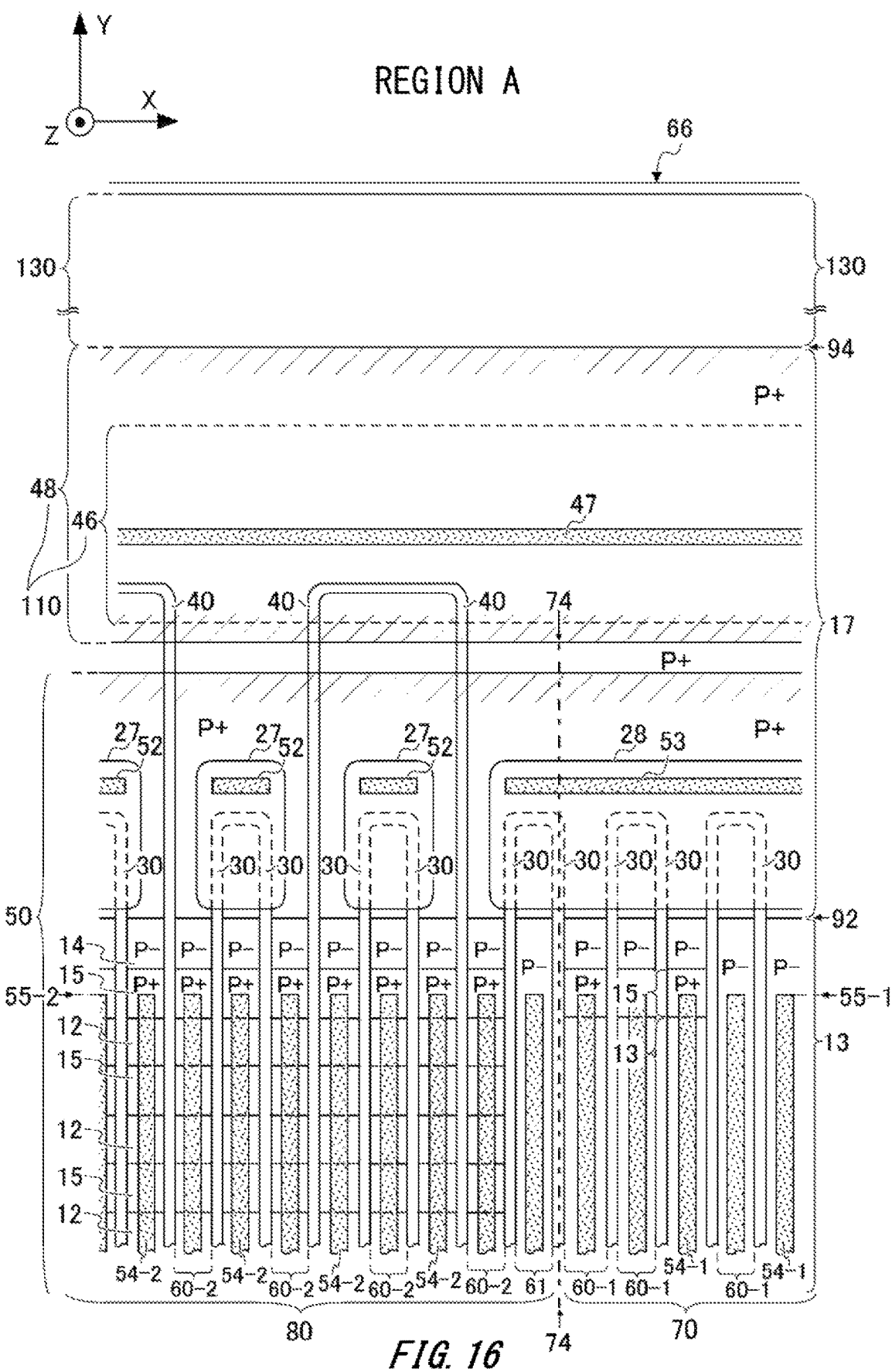
FIG. 16 is an enlarged view of the region A of FIG. 1 in the third embodiment.

FIG. 16 is an enlarged view of the region A in FIG. 1 of the third embodiment. For easy viewing of the figure, the accumulation region 16 and the cathode region 72 illustrated in FIG. 2 are omitted in FIG. 16, but the accumulation region 16 and the cathode region 72 described in the above-described embodiment and modification example can be used as appropriate. A boundary mesa region 61 of the present example in the IGBT region 80 includes a base region 14 instead of contact regions 15. That is, the X axis and Y-axis directions of the FWD region 70 are surrounded by a (P−)-type base region 14. The above configuration allows further reducing the amount of holes moving from the IGBT region 80 to the FWD region 70 than in the second embodiment. Therefore, the breakdown withstand capability of the FWD region 70 at the time of reverse recovery can be further improved than in the second embodiment.

However, each of mesa regions 60-1 in the FWD region 70 adjacent to the IGBT region 80 may include a contact region 15 at a position where ends 55-1 of contact portions 54-1 and the mesa regions 60-1 overlap. In the present example, first to third mesa regions 60-1 from the IGBT region 80 side in the FWD region 70 have contact regions 15. Therefore, the amount of holes at the time of reverse recovery in the FWD region 70 can be reduced compared to when no contact region 15 is provided in the mesa regions 60-1 at all because holes can be extracted to an emitter electrode 50 by the three mesa regions 60-1 in the vicinity of an upper surface side boundary 74.

However, at least one mesa regions 60-1 is not adjacent to the IGBT region 80 may not include contact regions 15 at a position where the ends 55-1 of the contact portions 54-1 in the Y-axis direction and the mesa regions 60-1 overlap. In the present example, contact regions 15 are not provided in mesa regions 60-1 other than the first to third mesa regions 60-1 from the IGBT region 80 side. This allows suppressing the implantation of holes from a well region 17 to the FWD region 70 by mesa regions 60-1 "other than" a plurality of mesa regions 60-1 at the IGBT region 80 side while extracting holes by a plurality of mesa regions 60-1 at the IGBT region 80 side in the FWD region 70. The first embodiment and the modification example thereof may be adopted as appropriate in the present example also.

Figure 17:
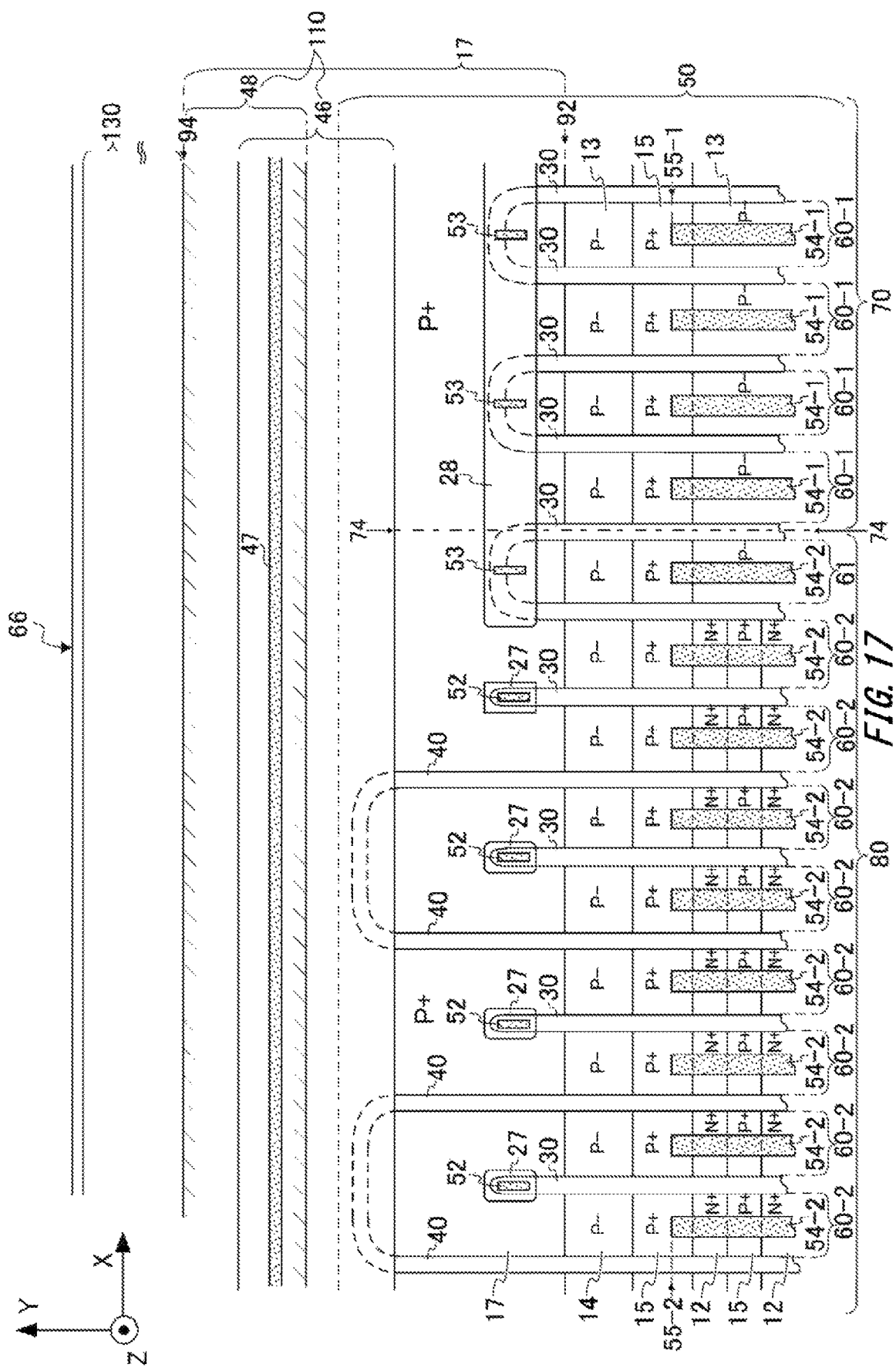
FIG. 17 is an enlarged view of the region A of FIG. 1 in the fourth embodiment.

FIG. 17 is an enlarged view of the region A in FIG. 1 of the fourth embodiment. Dummy trench portions 30 in an IGBT region 80 of the present example include only longitudinal portions and do not include lateral portions. That is, the dummy trench portions 30 in the IGBT region 80 of the present example have a liner shape. In the IGBT region 80, the dummy trench portions 30 and gate trench portions 40 are alternately provided in the X-axis direction. The present example differs from the first to third embodiments mainly in the above point. For saving space, an accumulation region 16 and a cathode region 72 are omitted in FIG. 17. However, it is needless to say that technical ideas according to the first to third embodiments and modification examples thereof may be applied to the present example.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or drawings can be performed in any order as long as the order is not indicated by "prior to," "before," or the like and as long as the output from a previous process is not used in a later process. Even if the process flow is described using phrases such as "first" or "next" in the claims, embodiments, and diagrams, it does not necessarily mean that the process must be performed in this order.

EXPLANATION OF REFERENCES

10: semiconductor substrate, 12: emitter region, 13: anode region, 14: base region, 15: contact region, 16: accumulation region, 17: well region, 18: drift region, 19: end, 20: buffer region, 22: collector region, 24: collector electrode, 26: lifetime killer region, 27, 28: connection layer, 30: dummy trench portion, 32: dummy trench insulating film, 33: dummy trench conductive portion, 34: dummy trenche, 36: insulating film, 38: interlayer dielectric film, 40: gate trench portion, 42: gate insulating film, 43: gate conductive portion, 44: gate trench, 46: gate runner layer, 47: contact portion, 48: gate metal layer, 50: emitter electrode, 52, 53, 54: contact portion, 55: end, 56: non-overlapping regions, 58: overlapping regions, 60: mesa region, 61: boundary mesa region, 62: upper surface, 64: lower surface, 66: outer peripheral end, 70: FWD region, 72: cathode region, 74: upper surface side boundary, 80: IGBT region, 82: lower surface side boundary, 92: end, 94: end, 96: bottom, 98: end, 100: active region, 110: gate runner portion, 112: annular gate runner portion, 114: extending gate runner portion, 120: gate pad portion, 130: edge termination region, 200: semiconductor device

What is claimed is:

1. A semiconductor device including a transistor region and a diode region in a semiconductor substrate, the semiconductor device comprising:
    a first conductivity type anode region provided in the semiconductor substrate in the diode region;
    a second conductivity type drift region that is provided at least in the diode region and is located below the anode region in the semiconductor substrate;
    a second conductivity type accumulation region that is provided at least in the diode region and is located between the anode region and the drift region in a depth direction of the semiconductor substrate;
    an insulating film that includes a plurality of contact portions extending in a first direction and is provided on an upper surface of the semiconductor substrate;
    a first conductivity type base region provided in the semiconductor substrate in the transistor region; and the drift region that is provided in the transistor region and is located below the base region in the semiconductor substrate; wherein the plurality of contact portions include a first contact portion provided in the diode region;

the first contact portion includes a first non-overlapping region in which the first contact portion and the accumulation region do not overlap in the depth direction at an end of the first contact portion in the first direction;

the accumulation region is provided in the transistor region and is located between the base region and the drift region in the depth direction of the semiconductor substrate;

the plurality of contact portions include a second contact portion provided in the transistor region;

the second contact portion includes a second non-overlapping region in which the second contact portion and the accumulation region do not overlap in the depth direction at an end of the second contact portion in the first direction; and a length of the first non-overlapping region differs from a length of the second non-overlapping region in the first direction.

2. The semiconductor device according to claim 1, wherein a length of the first non-overlapping region in the first direction is larger than a length of the second non-overlapping region in the first direction.

3. The semiconductor device according to claim 1, wherein a plurality of the transistor regions include an inner transistor region having both sides in a second direction perpendicular to the first direction sandwiched by a plurality of the diode regions; and an end of the accumulation region in the inner transistor region in the first direction is closer to an outer peripheral end of the semiconductor substrate than an end of the second contact portion in the first direction.

4. A semiconductor device including a transistor region and a diode region in a semiconductor substrate, the semiconductor device comprising:

a first conductivity type anode region provided in the semiconductor substrate in the diode region;

a second conductivity type drift region that is provided at least in the diode region and is located below the anode region in the semiconductor substrate;

a second conductivity type accumulation region that is provided at least in the diode region and is located between the anode region and the drift region in a depth direction of the semiconductor substrate; and an insulating film that includes a plurality of contact portions extending in a first direction and is provided on an upper surface of the semiconductor substrate; wherein the plurality of contact portions include a first contact portion provided in the diode region;

the first contact portion includes a first non-overlapping region in which the first contact portion and the accumulation region do not overlap in the depth direction at an end of the first contact portion in the first direction;

the semiconductor device includes an active region having a plurality of the transistor regions and a plurality of the diode regions;

each of the plurality of the transistor regions is an outer transistor region located at an end in a second direction perpendicular to the first direction;

the plurality of contact portions include a plurality of second contact portions provided in the outer transistor region;

each of the plurality of second contact portions includes a second non-overlapping region in which the second contact portion and the accumulation region do not overlap in the depth direction at an end of the second contact portion in the first direction; and in the outer transistor region located at the end in the second direction, the second non-overlapping region has a longer length in the first direction at a position closer to an outer peripheral end of the semiconductor substrate in the second direction.

5. The semiconductor device according to claim 4, wherein an entire second contact portion closest to an outer peripheral end of the semiconductor substrate in the second direction among the plurality of second contact portions does not overlap the accumulation region.

6. A semiconductor device including a transistor region and a diode region in a semiconductor substrate, the semiconductor device comprising:

a first conductivity type anode region provided in the semiconductor substrate in the diode region;

a second conductivity type drift region that is provided at least in the diode region and is located below the anode region in the semiconductor substrate;

a second conductivity type accumulation region that is provided at least in the diode region and is located between the anode region and the drift region in a depth direction of the semiconductor substrate; and an insulating film that includes a plurality of contact portions extending in a first direction and is provided on an upper surface of the semiconductor substrate; wherein the plurality of contact portions include a first contact portion provided in the diode region;

the first contact portion includes a first non-overlapping region in which the first contact portion and the accumulation region do not overlap in the depth direction at an end of the first contact portion in the first direction; and the diode region includes:

a plurality of dummy trench portions that extend in the first direction and are arrayed in a second direction perpendicular to the first direction; and a plurality of first mesa regions each being located between two dummy trench portions adjacent in the second direction among the plurality of dummy trench portions and being a part of the semiconductor substrate; and at least one first mesa region included in the plurality of first mesa regions does not include a first conductivity type contact region that includes a higher first conductivity type dopant concentration than the anode region and is connected to the first contact portion at a position where an end of the first contact portion in the first direction and the at least one first mesa region overlap.

7. The semiconductor device according to claim 6, wherein the transistor region includes:

a plurality of trench portions that extend in the first direction and are arrayed in a second direction perpendicular to the first direction; and a plurality of second mesa regions each being located between two trench portions adjacent in the second direction among the plurality of trench portions and being a part of the semiconductor substrate; and at least one second mesa region included in the plurality of second mesa regions includes the contact region at a position where an end of a second contact portion in the first direction and the at least one second mesa region overlap, the second contact portion being included in the plurality of contact portions and being provided in the transistor region.

8. The semiconductor device according to claim 7, wherein the plurality of second mesa regions include a boundary mesa region adjacent to the diode region in the second direction; and the boundary mesa region does not include the contact region and includes a first conductivity type base region having a lower first conductivity type doping concentration than the contact region.

9. The semiconductor device according to claim 6, wherein a first mesa region included in the plurality of first mesa regions and is adjacent to the transistor region includes the contact region at a position where an end of the first contact portion in the first direction and the first mesa region overlap; and at least one first mesa region included in the plurality of first mesa regions and is not adjacent to the transistor region does not include the contact region at a position where an end of the first contact portion in the first direction and the first mesa region overlap.

10. A semiconductor device including a transistor region and a diode region in a semiconductor substrate, the semiconductor device comprising:

a first conductivity type anode region provided in the semiconductor substrate in the diode region;

a second conductivity type drift region that is provided at least in the diode region and is located below the anode region in the semiconductor substrate;

a second conductivity type accumulation region that is provided at least in the diode region and is located between the anode region and the drift region in a depth direction of the semiconductor substrate; and an insulating film that includes a plurality of contact portions extending in a first direction and is provided on an upper surface of the semiconductor substrate; wherein the plurality of contact portions include a first contact portion provided in the diode region;

the first contact portion includes a first non-overlapping region in which the first contact portion and the accumulation region do not overlap in the depth direction at an end of the first contact portion in the first direction;

the transistor region includes a second conductivity type collector region provided at a lower-surface side of the semiconductor substrate;

the diode region includes a first conductivity type cathode region provided at the lower-surface side of the semiconductor substrate; and a lower surface side boundary that is a boundary between the collector region and the cathode region is located closer to a side of the diode region than an upper surface side boundary that is a boundary between the transistor region and the diode region at an upper-surface side of the semiconductor substrate in a second direction perpendicular to the first direction.

11. The semiconductor device according to claim 10, wherein a shortest distance in a case where an end of the first contact portion and an end of the accumulation region are projected on an upper surface of the semiconductor substrate is larger than a shortest distance in a case where an end of the accumulation region and an end of the cathode region are projected on the upper surface of the semiconductor substrate.

12. The semiconductor device according to claim 10, further comprising:

a first conductivity type well region provided in the semiconductor substrate in the diode region; wherein a shortest distance in a case where an inner end of the well region and an end of the first contact portion in the first direction are projected on the upper surface of the semiconductor substrate is larger than a shortest distance in a case where an end of the accumulation region and an end of the cathode region are projected on the upper surface of the semiconductor substrate.

13. The semiconductor device according to claim 12, further comprising; the well region provided in the transistor region; wherein the plurality of contact portions include a second contact portion provided in the transistor region; and a shortest distance in a case where the inner end of the well region and an end of the second contact portion in the first direction are projected on the upper surface of the semiconductor substrate is smaller than a shortest distance in a case where the inner end of the well region and an end of the first contact portion in the first direction are projected on the upper surface of the semiconductor substrate.

14. The semiconductor device according to claim 12, further comprising:

an extending gate runner portion provided between at least two of a plurality of the transistor regions adjacent to each other; and an annular gate runner portion that surrounds a plurality of the transistor regions and a plurality of the diode regions; wherein a shortest distance in a case where the inner end of the well region below the extending gate runner portion and a first end of the first contact portion in the first direction are projected on the upper surface of the semiconductor substrate is larger than a shortest distance in a case where the inner end of the well region below the annular gate runner portion and a second end of the first contact portion in the first direction are projected on the upper surface of the semiconductor substrate.

15. The semiconductor device according to claim 12, wherein a first retracted length of the cathode region that is a length from the lower surface side boundary to the upper surface side boundary in the second direction is equal to or greater than a second retracted length of the cathode region that is a length from the inner end of the well region to an end of the cathode region closest to an outer peripheral end in the first direction.

* * * * *